US011081528B2

(12) United States Patent
Tokuhara et al.

(10) Patent No.: US 11,081,528 B2
(45) Date of Patent: *Aug. 3, 2021

(54) IMAGING DEVICE INCLUDING PHOTOELECTRIC CONVERSION LAYER

(71) Applicant: Panasonic Intellectual Property Management Co., Ltd., Osaka (JP)

(72) Inventors: Takeyoshi Tokuhara, Osaka (JP); Shinichi Machida, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/891,367

(22) Filed: Jun. 3, 2020

(65) Prior Publication Data

US 2020/0295089 A1    Sep. 17, 2020

Related U.S. Application Data

(60) Continuation of application No. 16/570,012, filed on Sep. 13, 2019, now Pat. No. 10,707,272, which is a
(Continued)

(30) Foreign Application Priority Data

Apr. 10, 2017    (JP) .............................. JP2017-077445

(51) Int. Cl.
    *H01L 27/30*      (2006.01)
    *H01L 51/42*      (2006.01)
    (Continued)

(52) U.S. Cl.
    CPC ........ *H01L 27/307* (2013.01); *H01L 51/0072* (2013.01); *H01L 51/0073* (2013.01);
(Continued)

(58) Field of Classification Search
    CPC ............... H01L 27/307; H01L 51/0078; H01L 51/4273; H01L 51/442; H01L 51/0073;
(Continued)

(56) References Cited

U.S. PATENT DOCUMENTS

| 8,471,246 B2* | 6/2013 | Suzuki ................... B82Y 10/00 257/40 |
| 2007/0013798 A1 | 1/2007 | Ahn et al. |

(Continued)

FOREIGN PATENT DOCUMENTS

| EP | 3136460 A2 | 3/2017 |
| JP | 2007-088033 A | 4/2007 |

(Continued)

OTHER PUBLICATIONS

Tao, Y.T., et al., "Energy transfer vs. carrier trapping: emission mechanism in dye-doped organic light emitting diodes," Thin Solid Films 417 (2002) pp. 61-66.

(Continued)

*Primary Examiner* — Duy T Nguyen
(74) *Attorney, Agent, or Firm* — McDermott Will & Emery LLP

(57) ABSTRACT

An imaging device having pixels, each pixel including: a photoelectric conversion unit including a first electrode, a second electrode, a photoelectric conversion layer between the first and second electrodes, and a hole-blocking layer between the first electrode and the photoelectric conversion layer. The photoelectric conversion unit is applied with a voltage between the first electrode and the second electrode. The photoelectric conversion unit has a characteristic, responsive to the voltage within a range from a first voltage to a second voltage, showing that a density of current passing between the first electrode and the second electrode when light is incident on the photoelectric conversion layer (Continued)

becomes substantially equal to that when no light is incident on the photoelectric conversion layer. The range from the first voltage to the second voltage includes 0V, and a difference between the first voltage and the second voltage is 0.5 V or more.

8 Claims, 10 Drawing Sheets

Related U.S. Application Data division of application No. 15/938,374, filed on Mar. 28, 2018, now Pat. No. 10,461,130.

(51) Int. Cl.
*H01L 51/44* (2006.01)
*H01L 51/00* (2006.01)
*H04N 5/353* (2011.01)
*H04N 5/374* (2011.01)
*H01L 51/50* (2006.01)

(52) U.S. Cl.
CPC ...... *H01L 51/0078* (2013.01); *H01L 51/0094* (2013.01); *H01L 51/4273* (2013.01); *H01L 51/442* (2013.01); *H04N 5/353* (2013.01); *H04N 5/374* (2013.01); *H01L 51/0046* (2013.01); *H01L 51/0059* (2013.01); *H01L 51/5004* (2013.01); *H01L 2251/308* (2013.01); *Y02E 10/549* (2013.01)

(58) Field of Classification Search
CPC ............. H01L 51/0094; H01L 51/0072; H01L 51/5004; H01L 2251/308; H01L 51/0046; H01L 51/0059; H04N 5/353; H04N 5/374; H04N 5/2353; H04N 5/369; Y02E 10/549
USPC .......................................................... 257/40
See application file for complete search history.

(56) References Cited

U.S. PATENT DOCUMENTS

| | | |
|---|---|---|
| 2007/0063156 A1 | 3/2007 | Hayashi |
| 2009/0223566 A1* | 9/2009 | Mitsui ................ H01L 51/0047 136/263 |
| 2011/0049591 A1* | 3/2011 | Nakatani ........... H01L 27/14647 257/292 |
| 2013/0015435 A1* | 1/2013 | Sawaki ............... H01L 51/4253 257/40 |
| 2013/0020566 A1 | 1/2013 | Suzuki |
| 2017/0207355 A1 | 7/2017 | Beiley et al. |
| 2018/0219047 A1* | 8/2018 | Tokuhara ............... H04N 5/369 |

FOREIGN PATENT DOCUMENTS

| | | |
|---|---|---|
| JP | 2011-222949 A | 11/2011 |
| WO | 2010/120393 A2 | 10/2010 |
| WO | 2016/014345 A2 | 1/2016 |
| WO | 2018/025544 A1 | 2/2018 |
| WO | 2018/025545 A1 | 2/2018 |

OTHER PUBLICATIONS

The Extended European Search Report dated Jul. 31, 2018 for the related European Patent Application No. 18166053.1.
Ramuz Marc et al: "High sensitivity organic photodiodes with low dark currents and increased lifetimes", Organic Electronics, vol. 9, No. 3, Jun. 2008 (Jun. 2008), pp. 369-376, XP029170848.
Notice of Allowance issued in U.S. Appl. No. 15/938,374, dated Jul. 17, 2019.
Final Office Action issued in U.S. Appl. No. 15/938,374, dated Nov. 13, 2018.
Non-Final Office Action issued in U.S. Appl. No. 15/938,374, dated Aug. 3, 2018.
Notice of Allowance issued in U.S. Appl. No. 16/570,012, dated Mar. 4, 2020.

* cited by examiner

IMAGING DEVICE INCLUDING PHOTOELECTRIC CONVERSION LAYER

CROSS-REFERENCE OF RELATED APPLICATIONS

This application is a continuation application of U.S. patent application Ser. No. 16/570,012, filed on Sep. 13, 2019, now U.S. Pat. No. 10,707,272, which is a divisional application of U.S. patent application Ser. No. 15/938,374, filed on Mar. 28, 2018, now U.S. Pat. No. 10,461,130, which in turn claims the benefit of Japanese Patent Application No. 2017-077445, filed on Apr. 10, 2017, the entire disclosures of which applications are incorporated by reference herein.

BACKGROUND

Technical Field

The present disclosure relates to an imaging device.

Description of the Related Art

Image sensors that utilize photoelectric conversion have been known. For example, complementary metal-oxide-semiconductor (CMOS) image sensors that include photodiodes have been widely used. CMOS image sensors have advantages in that they consume low power and are capable of accessing to each pixel. Unlike charge-coupled device (CCD) image sensors, CMOS image sensors do not include a transfer region that enables simultaneous transfer of charge stored in each pixel. Therefore, CMOS image sensors commonly read a signal from each pixel by performing exposure and readout of signal charges sequentially in each row of a pixel array, that is, in a "rolling shutter" mode.

In a rolling shutter mode, exposure is started or terminated at a different timing in each row of a pixel array. Accordingly, when an image of a fast-moving subject is captured, the image of the subject may become distorted. In another case, when an image is captured using flash, brightness may vary within the image. For the above reasons, a function that enables exposure to be started or terminated at the same timing in all the pixels included in a pixel array, that is, a "global shutter" function, has been anticipated.

For example, U.S. Patent Application Publication No. 2007/0013798 discloses a CMOS image sensor capable of operating in a global shutter mode. In the technique described in U.S. Patent Application Publication No. 2007/0013798, each of a plurality of pixels includes a transfer transistor and a charge accumulation unit (i.e., a capacitor or a diode). In each of the pixels, the charge accumulation unit is connected to a photodiode via the transfer transistor.

SUMMARY

One non-limiting and exemplary embodiment provides an imaging device capable of achieving a global shutter function with a simple pixel circuit structure.

One non-limiting and exemplary embodiment provides the following. Specifically, in one general aspect, the techniques disclosed here feature an imaging device comprising pixels, each pixel including: a photoelectric conversion unit including a first electrode including a first conducting material, a second electrode facing the first electrode, a photoelectric conversion layer between the first and second electrodes, the photoelectric conversion layer including a first photoelectric conversion material, and a hole-blocking layer between the first electrode and the photoelectric conversion layer, the hole-blocking layer including a hole-blocking material. Each pixel further includes a signal detection transistor having a gate electrically connected to the first electrode. The hole-blocking material has an electron affinity lower than both a work function of the first conducting material and an electron affinity of the first photoelectric conversion material. The photoelectric conversion unit is adapted to be applied with a voltage between the first electrode and the second electrode. The photoelectric conversion unit has a characteristic, responsive to the voltage within a range from a first voltage to a second voltage, showing that a density of current passing between the first electrode and the second electrode when light is incident on the photoelectric conversion layer becomes substantially equal to that when no light is incident on the photoelectric conversion layer. The range from the first voltage to the second voltage includes 0V, and a difference between the first voltage and the second voltage is 0.5 V or more.

It should be noted that general or specific aspects may be implemented as an element, a device, a module, a system, an integrated circuit, a method, or any selective combination thereof.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

Figure 1:
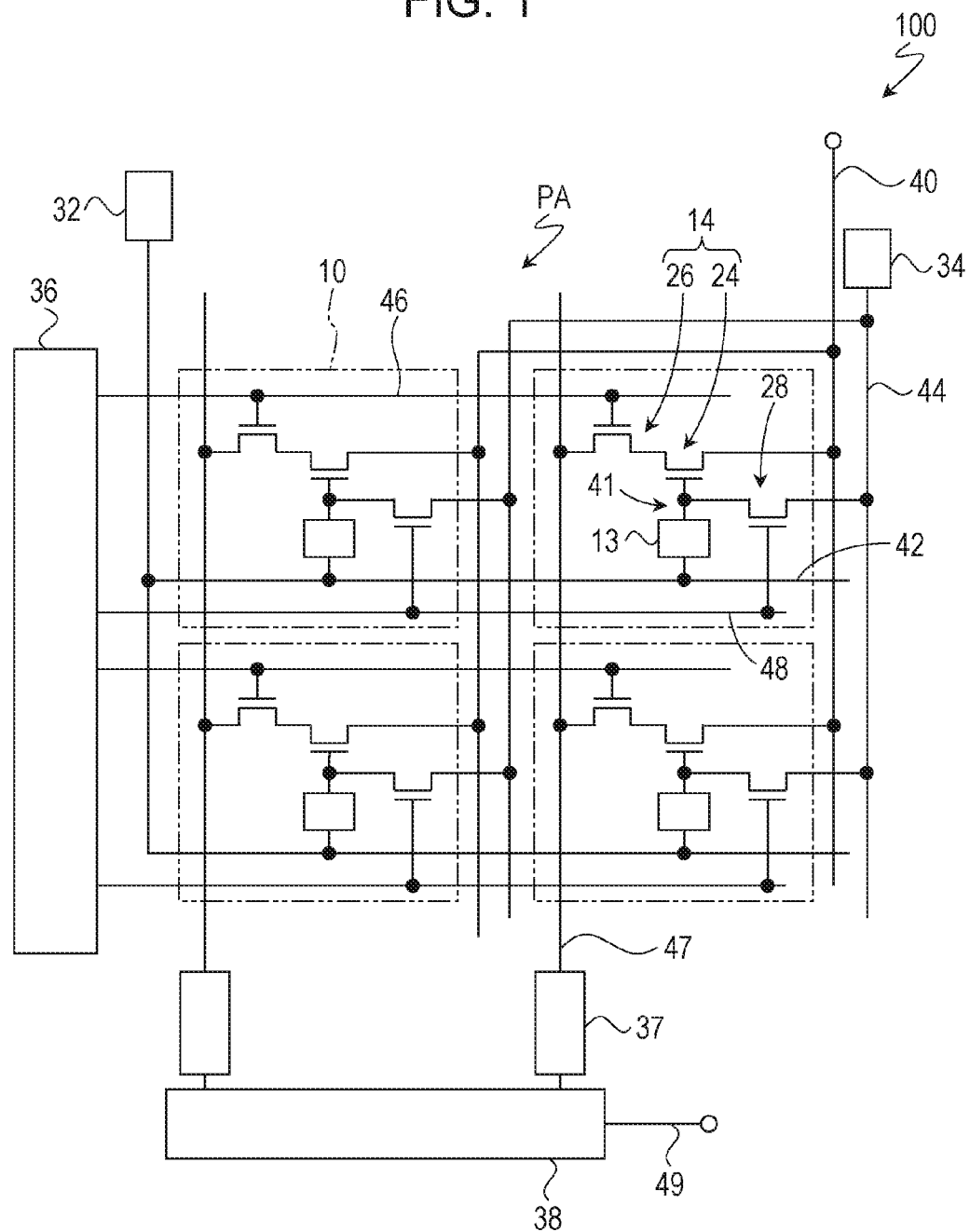
FIG. 1 is a schematic diagram illustrating an example of the circuit structure of an imaging device according to an embodiment of the present disclosure.

First, the knowledge found by the inventors of the present invention is described below. The inventors conducted detailed studies of a technique for achieving an imaging device capable of operating in a global shutter mode with a simple pixel circuit structure. For operating a CMOS image sensor in a global shutter mode, it is necessary to prevent the charge generated during a non-exposure period from mixing with the charge generated during an exposure period and being read out together with the charge generated during an exposure period. The term "non-exposure period" used herein includes a period during which signal charges are read from each pixel sequentially. That is, it is necessary to prevent, even when the pixels are irradiated with light in the non-exposure period, the charge generated by photoelectric conversion in the non-exposure period from affecting the charge generated during the exposure period. When a CMOS image sensor can be operated in the above manner, the CMOS image sensor can be operated in a global shutter mode even without using the charge accumulation unit as described in U.S. Patent Application Publication No. 2007/0013798. The inventors of the present invention devised a novel imaging device that includes a photoelectric conversion unit capable of performing the above operation.

The summary of an aspect of the present disclosure is as follows.

[1] An imaging device including unit pixels, each unit pixel including:
a photoelectric conversion unit including
a first electrode including a first conducting material,
a second electrode facing the first electrode,
a photoelectric conversion layer between the first and second electrodes, the photoelectric conversion layer including a first photoelectric conversion material, and
an electron-blocking layer between the first electrode and the photoelectric conversion layer, the electron-blocking layer including an electron-blocking material; and
a signal detection circuit electrically connected to the first electrode, wherein
the photoelectric conversion unit is adapted to be applied with a voltage between the first electrode and the second electrode,
the electron-blocking material has an ionization potential higher than both a work function of the first conducting material and an ionization potential of the first photoelectric conversion material, which allows the photoelectric conversion unit to have a range of the voltage within which a density of current passing between the first electrode and the second electrode when light is incident on the photoelectric conversion layer is substantially equal to that when no light is incident on the photoelectric conversion layer, and
the range of the voltage is 0.5 V or more.

The imaging device described in [1] is a hole-accumulation imaging device that may have a wide dynamic range and a global shutter function with a pixel circuit structure that does not require either a transfer transistor or an additional charge accumulation unit.

[2] The imaging device described in [1], wherein a difference in energy between the ionization potential of the electron-blocking material and the ionization potential of the first photoelectric conversion material is 0.2 eV or more.

[3] The imaging device described in [1] or [2], wherein a difference in energy between the ionization potential of the electron-blocking material and the ionization potential of the first photoelectric conversion material is 0.6 eV or less.

In the imaging device described in [3], the efficiency with which the charge generated by photoelectric conversion is extracted may be increased. This increases the sensitivity of the imaging device operated in a global shutter mode.

[4] The imaging device described in any one of [1] to [3], wherein the signal detection circuit detects holes extracted from the photoelectric conversion layer.

[5] The imaging device described in any one of [1] to [4], wherein the first photoelectric conversion material includes an organic material.

[6] The imaging device described in any one of [1] to [5], wherein:
the photoelectric conversion layer includes a second photoelectric conversion material; and
the second photoelectric conversion material has an ionization potential higher than an ionization potential of the first photoelectric conversion material or an electron affinity higher than an electron affinity of the first photoelectric conversion material.

[7] An imaging device including unit pixels, each unit pixel including:
a photoelectric conversion unit including
a first electrode including a first conducting material,
a second electrode facing the first electrode,
a photoelectric conversion layer between the first and second electrodes, the photoelectric conversion layer including a first photoelectric conversion material, and
a hole-blocking layer between the first electrode and the photoelectric conversion layer, the hole-blocking layer including a hole-blocking material; and
a signal detection circuit electrically connected to the first electrode, wherein
the hole-blocking material has an electron affinity lower than both a work function of the first conducting material and an electron affinity of the first photoelectric conversion material,
the photoelectric conversion unit is adapted to be applied with a voltage between the first electrode and the second electrode, and the photoelectric conversion unit has a characteristic, responsive to the voltage within a range from a first voltage to a second voltage, showing that a density of current passing between the first electrode and the second electrode when light is incident on the photoelectric conversion layer becomes substantially equal to that when no light is incident on the photoelectric conversion layer, and a difference between the first voltage and the second voltage is 0.5 V or more.

The imaging device described in [7] is an electron-accumulation imaging device that may have a wide dynamic range and a global shutter function with a pixel circuit structure that does not require either a transfer transistor or an additional charge accumulation unit.

[8] The imaging device described in [7], wherein a difference in energy between the electron affinity of the hole-blocking material and the electron affinity of the first photoelectric conversion material is 0.2 eV or more.

[9] The imaging device described in [7] or [8], wherein a difference in energy between the electron affinity of the hole-blocking material and the electron affinity of the first photoelectric conversion material is 0.6 eV or less.

In the imaging device described in [9], the efficiency with which the charge generated by photoelectric conversion is extracted may be increased. This increases the sensitivity of the imaging device operated in a global shutter mode.

[10] The imaging device described in any one of [7] to [9], wherein the signal detection circuit detects electrons extracted from the photoelectric conversion layer.

[11] The imaging device described in any one of [7] to [10], wherein the first photoelectric conversion material includes an organic material.

[12] The imaging device described in any one of [7] to [11], wherein:

the photoelectric conversion layer includes a second photoelectric conversion material; and the second photoelectric conversion material has an electron affinity lower than an electron affinity of the first photoelectric conversion material or an ionization potential lower than an ionization potential of the first photoelectric conversion material.

[13] The imaging device described in [6], wherein:
the first conducting material includes aluminum;
the second electrode includes indium tin oxide;
the electron-blocking material includes the compound represented by Formula (4) below;

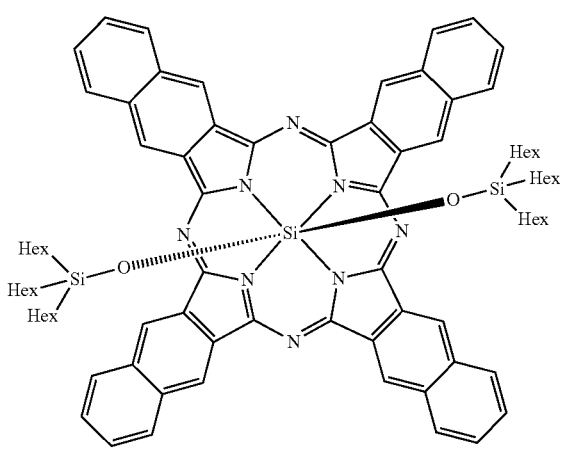

(2)

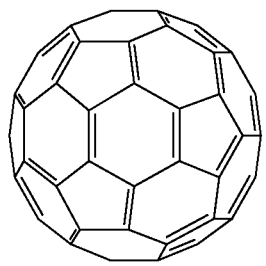

(3)

[14] The imaging device described in [6], wherein:

the first conducting material includes aluminum;

the second electrode includes indium tin oxide;

the electron-blocking material includes the compound represented by Formula (5) below;

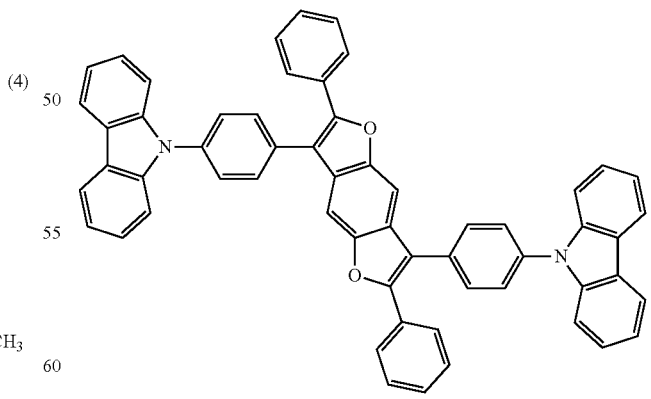

(4)

(5)

the first photoelectric conversion material includes the compound represented by Formula (2) below; and the second photoelectric conversion material includes the compound represented by Formula (3) below.

the first photoelectric conversion material includes the compound represented by Formula (2) below; and the second photoelectric conversion material includes the compound represented by Formula (3) below.

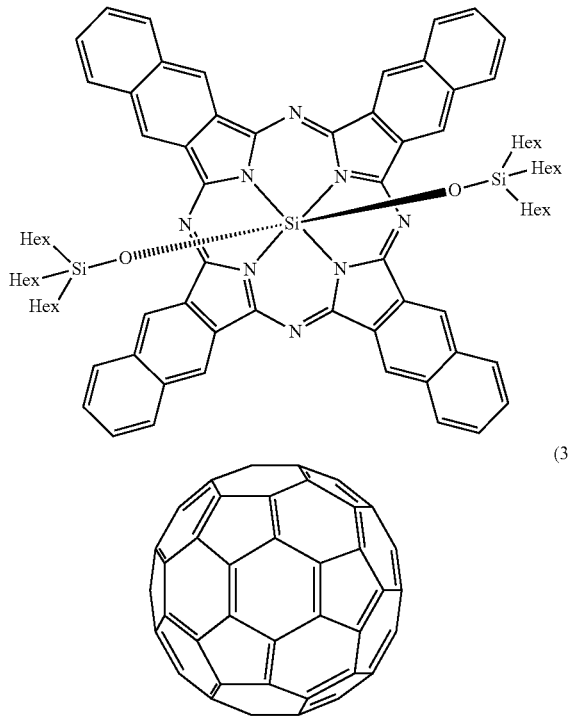

[15] An imaging device including:
unit pixels, each unit pixel including
a first electrode,
a charge accumulation region electrically connected to the first electrode, and
a signal detection circuit electrically connected to the charge accumulation region;
a second electrode arranged to face the first electrode; and
a photoelectric conversion layer between the first and second electrodes, wherein
the each unit pixel has a first voltage range, a density of a current output in a state where the photoelectric conversion layer is irradiated with light being substantially equal to a current output in a state where the photoelectric conversion layer is not irradiated with light when any voltage within the first voltage range is applied between the first and second electrodes, and the first voltage range has a width of 0.5 V or more.

The imaging device described in [15] may achieve a global shutter function with a pixel circuit structure that does not require either a transfer transistor or an additional charge accumulation unit.

[16] The imaging device described in any one of [1] to [15], wherein the difference between the first voltage and the second voltage is 0.5 V or more and 5.5 V or less.

Embodiments of the present disclosure are described below in detail with reference to the attached drawings. In the following embodiments, general or specific examples are described. All the values, shapes, materials, components, the arrangement of the components, and the connection between the components, steps, the order of the steps, and the like described in the following embodiments are merely an example and are not intended to limit the scope of the present disclosure. The various aspects described herein may be combined with one another unless a contradiction arises. Among the components described in the following embodiments, components that are not described in any one of the independent claims, which indicate the broadest concepts, are described as optional components. In the following description, components that have substantially the same function are denoted by the same reference numeral, and the description thereof may be omitted.

Embodiment

FIG. 1 is an example of the circuit structure of an imaging device according to an embodiment of the present disclosure. The imaging device 100 illustrated in FIG. 1 includes a pixel array PA that includes a plurality of unit pixels 10 arranged in a two-dimensional array. FIG. 1 schematically illustrates an example where the unit pixels 10 are arranged in a matrix having two rows and two columns. The number and arrangement of the unit pixels 10 included in the imaging device 100 are not limited to those in the example illustrated in FIG. 1.

Each of the unit pixels 10 includes a photoelectric conversion unit 13 and a signal detection circuit 14. As described below with reference to the drawings, the photoelectric conversion unit 13 includes two electrodes arranged to face each other and a photoelectric conversion layer interposed therebetween and generates signal charges upon receiving incident light. The photoelectric conversion unit 13 is not necessarily an element in which all the components are exclusively provided for each of the unit pixels 10. For example, some of the components of the photoelectric conversion unit 13 may extend across the plurality of unit pixels 10. The signal detection circuit 14 is a circuit that detects the signal charges generated by the photoelectric conversion unit 13. In this example, the signal detection circuit 14 includes a signal detection transistor 24 and an address transistor 26. The signal detection transistor 24 and the address transistor 26 are typically field-effect transistors (FETs). In this example, the signal detection transistor 24 and the address transistor 26 are composed of an N-channel metal oxide semiconductor (MOS).

As described schematically in FIG. 1, the control terminal of the signal detection transistor 24 is electrically connected to the photoelectric conversion unit 13. In this example, the control terminal of the signal detection transistor 24 serves as a gate. The signal charges generated by the photoelectric conversion unit 13 are accumulated at a charge accumulation region 41, which is located between the gate of the signal detection transistor 24 and the photoelectric conversion unit 13. The signal charges generated by the photoelectric conversion unit 13 are, for example, holes or electrons. The charge accumulation region 41 is also referred to as "floating diffusion node". That is, the signal detection circuit 14 including the signal detection transistor 24 is electrically connected to the charge accumulation region 41. The detailed structure of the photoelectric conversion unit 13 is described below.

As illustrated in FIG. 1, in the imaging device 100, each of the unit pixels 10 does not include either a charge accumulation region other than the charge accumulation region 41 or a transfer transistor used as a switch for transferring charge from the charge accumulation region 41 to another charge accumulation region. Therefore, the unit pixels 10 have a simple structure.

The photoelectric conversion unit 13 included in each of the unit pixels 10 is further connected to the corresponding one of sensitivity control lines 42. In the example structure illustrated in FIG. 1, the sensitivity control lines 42 are connected to a voltage supply circuit 32. The voltage supply circuit 32 is a circuit capable of selectively applying at least two types of voltages to the photoelectric conversion units 13. While the imaging device 100 is operated, the voltage supply circuit 32 applies a predetermined voltage to the photoelectric conversion units 13 through the sensitivity control lines 42. The voltage supply circuit 32 is not limited to a specific power source circuit. The voltage supply circuit 32 may be a circuit that generates the predetermined voltage or a circuit that converts a voltage applied by another power source into the predetermined voltage. As is described below in detail, upon the voltage supply circuit 32 changing the voltage applied to the photoelectric conversion units 13, the accumulation of the signal charges generated by the photoelectric conversion unit 13 at the charge accumulation region 41 is started or terminated. In other words, in the embodiment of the present disclosure, upon the voltage supply circuit 32 changing the voltage applied to the photoelectric conversion unit 13, the action of an electronic shutter is executed. An example of the action of the imaging device 100 is described below.

Each of the unit pixels 10 is connected to a power source line 40, through which a power source voltage VDD is supplied. As illustrated in FIG. 1, the power source line 40 is connected to the input terminal of the signal detection transistor 24. The input terminal of the signal detection transistor 24 typically serves as a drain. The power source line 40 serves as a source-follower power source, which enables the signal detection transistor 24 to amplify the signal generated by the photoelectric conversion unit 13 and output the amplified signal.

The output terminal of the signal detection transistor 24 is connected to the input terminal of the address transistor 26. In this example, the output terminal of the signal detection transistor 24 serves as a source, and the input terminal of the address transistor 26 serves as a drain. The output terminal of the address transistor 26 is connected to the corresponding one of a plurality of vertical signal lines 47, which are provided for the respective columns of the pixel array PA. In this example, the output terminal of the address transistor 26 serves as a source. The control terminal of the address transistor 26 is connected to the corresponding one of address control lines 46. In this example, the control terminal of the address transistor 26 serves as a gate. Controlling the potentials of the address control lines 46 enables the data output from the signal detection transistors 24 to be each selectively read through the corresponding one of the vertical signal lines 47.

In the example illustrated in FIG. 1, the address control lines 46 are connected to a vertical scanning circuit 36, which is also referred to as "row scanning circuit". The vertical scanning circuit 36 selects a plurality of the unit pixels 10 disposed in each row on a row-by-row basis by applying a predetermined voltage to the corresponding one of the address control lines 46. This enables the readout of the signal charge from the selected unit pixels 10.

The vertical signal lines 47 are main signal lines through which pixel signals output from the pixel array PA are transmitted to the peripheral circuits. Each of the vertical signal lines 47 is connected to the corresponding one of column-signal processing circuits 37, which are also referred to as "row-signal accumulation circuits". The column-signal processing circuits 37 perform, for example, noise-reduction signal processing, such as correlated double sampling, and analog-digital conversion (i.e., AD conversion). As illustrated in FIG. 1, the column-signal processing circuits 37 are provided for the respective columns of the unit pixels 10 in the pixel array PA. The column-signal processing circuits 37 are connected to a horizontal signal readout circuit 38, which is also referred to as "column-scanning circuit". The horizontal signal readout circuit 38 sequentially reads a signal from each of the column-signal processing circuits 37 to a horizontal common signal line 49.

In the example structure illustrated in FIG. 1, each of the unit pixels 10 includes a reset transistor 28. The reset transistor 28 may be a field-effect transistor or the like, similarly to the signal detection transistor 24 and the address transistor 26. In the example described below, the reset transistor 28 is composed of an N-channel MOS unless otherwise specified. As illustrated in FIG. 1, the reset transistor 28 is connected to a reset voltage line 44, through which a reset voltage Vr is supplied, and to the charge accumulation region 41. The control terminal of the reset transistor 28, which serves as a gate in this example, is connected to the corresponding one of reset control lines 48, and the potential of the charge accumulation region 41 can be reset to the reset voltage Vr by controlling the potential of the reset control line 48. In this example, the reset control lines 48 are connected to the vertical scanning circuit 36. Thus, it is possible to reset a plurality of the unit pixels 10 which are disposed in each row on a row-by-row basis by the vertical scanning circuit 36 applying a predetermined voltage to the corresponding one of the reset control lines 48.

In this example, the reset voltage line 44, through which the reset voltage Vr is supplied to the reset transistors 28, is connected to a reset voltage supply circuit 34. Hereinafter, the reset voltage supply circuit 34 is referred to simply as "reset voltage source 34". The reset voltage source 34 may be any voltage source that allows a predetermined reset voltage Vr to be supplied through the reset voltage line 44 during the operation of the imaging device 100 and is not limited to a specific power source circuit, similarly to the voltage supply circuit 32 described above. The voltage supply circuit 32 and the reset voltage source 34 may be parts of a single voltage supply circuit or may be independent voltage supply circuits. One or both of the voltage supply circuit 32 and the reset voltage source 34 may be a part of the vertical scanning circuit 36. Alternatively, at least one of a sensitivity control voltage applied by the voltage supply circuit 32 and the reset voltage Vr applied by the reset voltage source 34 may be supplied to the unit pixels 10 via the vertical scanning circuit 36.

The power source voltage VDD supplied to the signal detection circuits 14 may be used also as a reset voltage Vr. In such a case, a voltage supply circuit (not illustrated in FIG. 1) that supplies a power source voltage to the unit pixels 10 may be used also as a reset voltage source 34. Furthermore, it is possible to use the power source line 40 also as the reset voltage line 44, which allows the arrangement of wires in the pixel array PA to be simplified. However, setting the reset voltage Vr to be different from the power source voltage VDD supplied to the signal detection circuits 14 may increase the degree of flexibility in the control of the imaging device 100.

Device Structure of Unit Pixel

Figure 2:
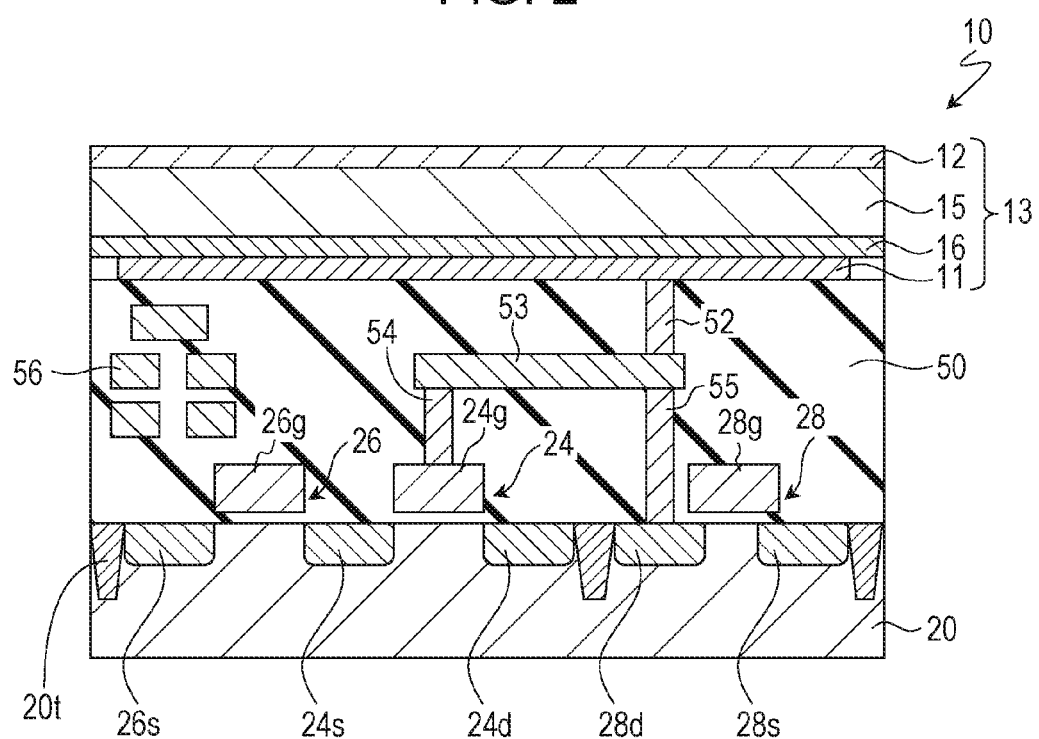
FIG. 2 is a schematic cross-sectional view of a unit pixel, illustrating an example of the device structure of the unit pixel.

FIG. 2 schematically illustrates an example of the device structure of the unit pixels 10. In the example structure illustrated in FIG. 2, the above-described signal detection transistor 24, the address transistor 26, and the reset transistor 28 are formed on a semiconductor substrate 20. The semiconductor substrate 20 is not limited to a substrate the entirety of which is composed of a semiconductor and may be an insulating substrate that includes a semiconductor layer disposed on a surface thereof on which the photoelectric conversion unit 13 is to be disposed. In the example described below, a p-type silicon (Si) substrate is used as a semiconductor substrate 20.

The semiconductor substrate 20 includes impurity regions (in this example, N-type regions) 26s, 24s, 24d, 28d, and 28s. The semiconductor substrate 20 also includes element separation regions 20t in order to electrically separate the unit pixels 10 from one another. In this example, the element separation region 20t is interposed also between the impurity regions 24d and 28d. The element separation regions 20t can be formed by, for example, performing injection of acceptor ions under predetermined injection conditions.

The impurity regions 26s, 24s, 24d, 28d, and 28s are typically diffusion layers formed in the semiconductor substrate 20. As schematically illustrated in FIG. 2, the signal detection transistor 24 includes impurity regions 24s and 24d and a gate electrode 24g, which is typically a polysilicon electrode. The impurity regions 24s and 24d serve as, for example, the source region and the drain region, respectively, of the signal detection transistor 24. The channel region of the signal detection transistor 24 is formed between the impurity regions 24s and 24d.

Similarly to the signal detection transistor 24, the address transistor 26 includes impurity regions 26s and 24s and a gate electrode 26g, which is typically a polysilicon electrode, connected to the corresponding one of the address control lines 46 (see FIG. 1). In this example, the signal detection transistor 24 and the address transistor 26 are electrically connected to each other by sharing the impurity region 24s. The impurity region 26s serves as, for example, the source region of the address transistor 26. The impurity region 26s is connected to the corresponding one of the vertical signal lines 47 (see FIG. 1), which is not illustrated in FIG. 2.

The reset transistor 28 includes impurity regions 28d and 28s and a gate electrode 28g, which is typically a polysilicon electrode, connected to the corresponding one of the reset control lines 48 (see FIG. 1). The impurity region 28s serves as, for example, the source region of the reset transistor 28. The impurity region 28s is connected to the reset voltage line 44 (see FIG. 1), which is not illustrated in FIG. 2.

An interlayer insulating layer 50, which is typically a silicon dioxide layer, is disposed on the semiconductor substrate 20 so as to cover the signal detection transistor 24, the address transistor 26, and the reset transistor 28. The interlayer insulating layer 50 may include a wiring layer 56 formed therein as illustrated in FIG. 2. The wiring layer 56, which is typically composed of a metal, such as copper, may include wires such as the vertical signal lines 47 described above. The number of insulating sublayers constituting the interlayer insulating layer 50 and the number of sublayers constituting the wiring layer 56 formed in the interlayer insulating layer 50 may be set appropriately and are not limited to those in the example illustrated in FIG. 2.

The above-described photoelectric conversion unit 13 is disposed on the interlayer insulating layer 50. In other words, in the embodiment of the present disclosure, a plurality of the unit pixels 10 constituting the pixel array PA (see FIG. 1) are formed on the semiconductor substrate 20. The unit pixels 10, which are arranged on the semiconductor substrate 20 in a two-dimensional array, form a pixel region. The pixel pitch of the imaging device 100 is, for example, about 2 μm. The term "pixel pitch" used herein refers to the distance between the center lines of a pair of adjacent unit pixels 10.

The photoelectric conversion unit 13 includes a first electrode 11, a second electrode 12 arranged to face the first electrode 11, and a photoelectric conversion layer 15 interposed between the electrodes. In this embodiment, the photoelectric conversion unit 13 further includes a charge-blocking layer 16 interposed between the first electrode 11 and the photoelectric conversion layer 15. In this example, the second electrode 12 and the photoelectric conversion layer 15 are formed so as to extend across a plurality of the unit pixels 10, while the first electrode 11 is provided for each of the unit pixels 10. Each of the first electrodes 11 is electrically separated from other first electrodes 11 included in the adjacent unit pixels 10 by being spatially separated from them. In the imaging device 100, holes or electrons of the electron-hole pairs generated by photoelectric conversion in the photoelectric conversion layer 15 can be collected with the first electrode 11 when the potential of the second electrode 12 with respect to the potential of the first electrode 11 is controlled in an appropriate manner. For example, in the case where holes are used as signal charges, setting the potential of the second electrode 12 to be higher than that of the first electrode 11 enables holes to be selectively collected by the first electrode 11. In the example described below, holes are used as signal charges. Note that, electrons may alternatively be used as signal charges.

The first electrode 11 is composed of a metal, a metal nitride, a metal oxide, a conductive polysilicon, or the like. Examples of the metal include aluminum, copper, titanium, and tungsten. One of the methods for making polysilicon electrically conductive is to dope polysilicon with an impurity. The first electrode 11 may be a light-shielding electrode. Using a light-shielding electrode as a first electrode 11 may reduce the intrusion of light that passes through the photoelectric conversion layer 15 into the channel regions or the impurity regions of the transistors formed in the semiconductor substrate 20. In FIG. 2, the transistors formed in the semiconductor substrate 20 are at least any of the signal detection transistor 24, the address transistor 26, and the reset transistor 28. Alternatively, the intrusion of the light into the transistors formed in the semiconductor substrate 20 may be reduced by using the wiring layer 56. Reducing the intrusion of the light into the channel regions of the transistors formed in the semiconductor substrate 20 may limit variations in the properties of the transistors. Examples of the variations in the properties of the transistors include a shift in threshold voltage. Reducing the intrusion of the light into the impurity regions formed in the semiconductor substrate 20 may also limit the mixing of noises generated by unintended photoelectric conversion occurring in the impurity regions. Thus, reducing the intrusion of the light into the semiconductor substrate 20 may enhance the reliability of the imaging device 100.

The second electrode 12 is typically a transparent electrode composed of a transparent conducting material. The second electrode 12 is disposed on a side of the photoelectric conversion layer 15 on which light enters. That is, light that passes through the second electrode 12 enters the photoelectric conversion layer 15. The wavelength of light that can be detected by the imaging device 100 is not limited to be within the visible range (e.g., 380 nm or more and 780 nm or less). The term "transparent" used herein refers to passing at least part of the wavelengths of light which are to be detected; it is not necessary to pass all the wavelengths of visible light. Hereinafter, all electromagnetic waves including infrared radiation and ultraviolet radiation are collectively referred to as "light" for the sake of convenience. The second electrode 12 may be composed of, for example, a transparent conducting oxide (TCO), such as indium tin oxide (ITO), indium zinc oxide (IZO), aluminium-doped zinc oxide (AZO), fluorine-doped tin oxide (FTO), $SnO_2$, $TiO_2$, or $ZnO_2$. Note that, when the semiconductor substrate 20 and the first electrode 11 are transparent to the incident light, an electrode that is not transparent may be used as a second electrode. For example, the second electrode 12 may be composed of a metal material having a high reflectivity, such as Al, Au, and Ag. For example, an image sensor including a transparent substrate may be achieved when a thin-film transistor is used as a signal detection transistor instead of a crystalline Si transistor. In such a case, an image sensor in which light enters on the substrate-side is produced by using a transparent electrode as a first electrode. Examples of the thin-film transistor include a thin-film transistor that includes an oxide semiconductor, a thin-film transistor that includes an organic semiconductor, and a thin-film transistor that includes an amorphous Si thin-film. Examples of the oxide semiconductor include indium gallium zinc oxide (IGZO). Examples of the transparent substrate include a glass substrate and a plastic film substrate composed of polyethylene terephthalate (PET), polyethylene naphthalate (PEN), or the like.

As described above with reference to FIG. 1, the second electrode 12 is connected to the corresponding one of the sensitivity control lines 42, which are connected to the voltage supply circuit 32. In this example, the second electrode 12 is formed so as to extend across a plurality of the unit pixels 10. This enables the voltage supply circuit 32 to apply a desired sensitivity control voltage to a plurality of the unit pixels 10 at a time through the sensitivity control lines 42. Alternatively, each of the unit pixels 10 may be provided with one second electrode 12 as long as a desired sensitivity control voltage can be applied from the voltage supply circuit 32. Similarly, each of the unit pixels 10 may be provided with one photoelectric conversion layer 15.

The photoelectric conversion layer 15 is composed typically of a semiconductor material. Upon the photoelectric conversion layer 15 being irradiated with light, electron-hole pairs are generated inside the photoelectric conversion layer 15. The electron-hole pairs are divided into electrons and holes by the electric field applied to the photoelectric conversion layer 15. The electrons and holes are each transferred toward the first or second electrode 11 or 12 in accordance with the electric field. Although the photoelectric conversion layer 15 is composed of an organic semiconductor material in the example described herein, the photoelectric conversion layer 15 may be composed of hydrogenated amorphous silicon, a compound semiconductor material, a metal oxide semiconductor material, or the like. Examples of the compound semiconductor material include CdSe. Examples of the metal oxide semiconductor material include ZnO. In the case where the photoelectric conversion layer 15 is composed of an organic semiconductor material, the photoelectric conversion layer 15 may be a multilayer film formed by the deposition of a donor material and an acceptor material or a mixed film including a donor material and an acceptor material. The multilayer film formed by the deposition of a donor material and an acceptor material is referred to as a heterojunction film. The mixed film including a donor material and an acceptor material is referred to as a bulk heterojunction film. One or both of the donor material and the acceptor material may absorb light. A material that donates an electron of electron-hole pairs generated upon the material absorbing light to another material is referred to as a donor material. A material that accepts the electron is referred to as an acceptor material. In the case where two organic semiconductors are used, which of the two organic semiconductors serves as a donor material or an acceptor material is generally determined by the relative positions of the energy levels of the highest-occupied molecular orbital (HOMO) and the lowest-unoccupied molecular orbital (LUMO) of the two organic semiconductors at the interface at which the organic semiconductors are brought into contact with each other. Specifically, an organic semiconductor having a LUMO, which accepts an electron, having a shallower energy level serves as a donor material, while an organic semiconductor having a LUMO having a deeper energy level serves as an acceptor material.

The charge-blocking layer 16 allows charges generated in the photoelectric conversion layer 15 which have a particular polarity to be transported toward the first electrode 11 and blocks the other charges having the opposite polarity from being transported toward the first electrode. Therefore, the charge-blocking layer 16 does not necessarily have an insulating property. Whether or not the above selective charge transportation is achieved is determined by the height of the energy barrier at the interface between the charge-blocking layer 16 and the photoelectric conversion layer 15 or between the charge-blocking layer 16 and the first electrode. An example where electrons are transported from the photoelectric conversion layer 15 including a material having a LUMO energy level of 4.0 eV to the first electrode 11 including a material having a Fermi level of 5.1 eV is described below. When the charge-blocking layer 16 allows electrons to be transported from the photoelectric conversion layer 15 to the first electrode and blocks holes from being transported from the photoelectric conversion layer 15 to the first electrode, the charge-blocking layer 16 may be referred to as a "hole-blocking layer". In this case, the deeper than or substantially equal to 4.0 eV the LUMO energy level of the material included in the charge-blocking layer 16, the smaller the energy barrier between the photoelectric conversion layer 15 and the charge-blocking layer 16 and, accordingly, the higher the efficiency with which electrons are transported from the photoelectric conversion layer 15 to the first electrode 11. The deeper than 5.1 eV the HOMO energy level of the material included in the charge-blocking layer 16, the larger the energy barrier between the charge-blocking layer 16 and the first electrode 11 and, accordingly, the higher the capability of the charge-blocking layer 16 to block holes from being injected from the first electrode 11 to the photoelectric conversion layer 15. For example, since fullerene has a LUMO energy level of 4.0 eV and a HOMO energy level of 6.4 eV, fullerene can be used as a hole-blocking material for forming the charge-blocking layer 16 while also serving as a material that transports electrons. The HOMO energy level of an organic material can be determined by photoelectron spectroscopy, photoemission yield spectroscopy, or the like. LUMO energy level can be determined by using inverse photoelectron spectroscopy or by subtracting the energy of an end portion of the absorption spectrum from the HOMO energy level.

As described below in detail, the voltage supply circuit 32 applies different voltages to the second electrode 12 between the exposure period and the non-exposure period. The term "exposure period" used herein refers to the period in which positive or negative charges generated by photoelectric conversion are accumulated at the charge accumulation region. Therefore, the exposure period may be referred to also as "charge accumulation period". The term "non-exposure period" used herein refers to the period in which the imaging device is operated and which is other than the exposure period. The non-exposure period may be a period during which the photoelectric conversion unit 13 is not irradiated with light or a period during which the photoelectric conversion unit 13 is irradiated with light but charge is not accumulated at the charge accumulation region.

As schematically illustrated in FIG. 2, the first electrode 11 is connected to the gate electrode 24g of the signal detection transistor 24 with a plug 52, a wire 53, and a contact plug 54. In other words, the gate of the signal detection transistor 24 is electrically connected to the first electrode 11. The plug 52 and the wire 53 are composed of, for example, a metal, such as copper. The plug 52, the wire 53, and the contact plug 54 constitute at least a part of the charge accumulation region 41 (see FIG. 1), which is located between the signal detection transistor 24 and the photoelectric conversion unit 13. The wire 53 may constitute a part of the wiring layer 56. The first electrode 11 is also connected to the impurity region 28d with the plug 52, the wire 53, and a contact plug 55. In the example structure illustrated in FIG. 2, the gate electrode 24g of the signal detection transistor 24, the plug 52, the wire 53, the contact plugs 54 and 55, and the impurity region 28d, which serves as a source or drain region of the reset transistor 28, serve as a charge accumulation region 41, at which the signal charges collected by the first electrode 11 are accumulated.

Upon the signal charges being collected by the first electrode 11, a voltage responsive to the amount of signal charges accumulated at the charge accumulation region 41 is applied to the gate of the signal detection transistor 24. The signal detection transistor 24 amplifies the voltage. The voltage amplified by the signal detection transistor 24 is selectively read as a signal voltage to the corresponding one of vertical signal lines 47 via the address transistor 26.

As described below, the voltage supply circuit 32 is capable of applying predetermined voltages to the second electrode 12. The voltage supply circuit 32 applying a different voltage to the second electrode 12 between the exposure period and the non-exposure period enables the imaging device 100 to be controlled such that, even when the photoelectric conversion unit 13 is irradiated with light in the non-exposure period, the charges generated in the photoelectric conversion unit 13 are substantially not transferred to the charge accumulation region 41.

Properties of Photoelectric Conversion Unit 13

Figure 3:
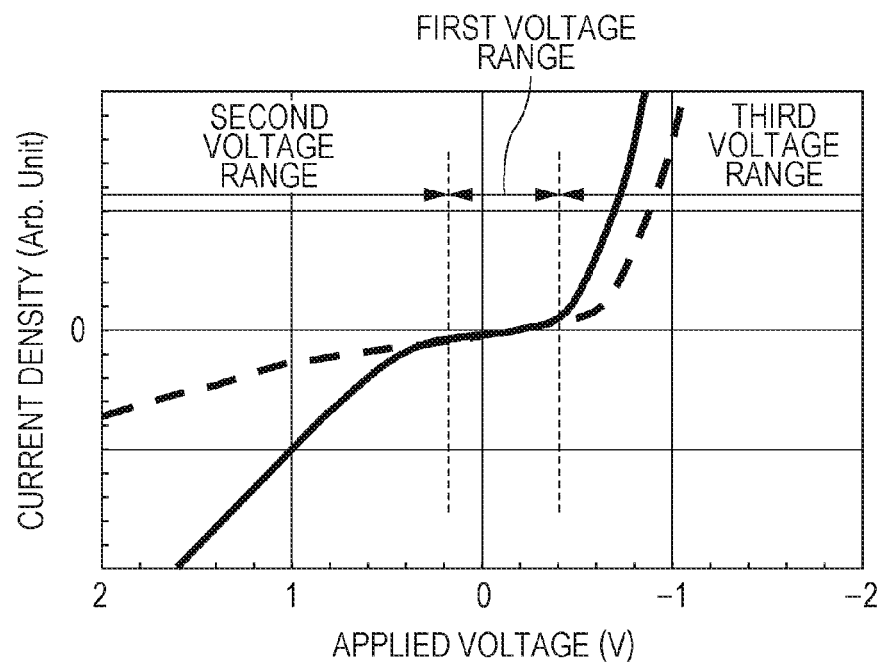
FIG. 3 is a diagram illustrating an example of the current-voltage characteristic of a photoelectric conversion unit included in an imaging device according to an embodiment of the present disclosure.

FIG. 3 schematically illustrates an example of the current-voltage characteristic of the photoelectric conversion unit 13. In FIG. 3, an example of the I-V characteristic of the photoelectric conversion unit 13 which is measured when a voltage is applied between the first and second electrodes 11 and 12 under the condition where the photoelectric conversion unit 13 is irradiated with light is shown with a wide solid line. FIG. 3 also illustrates, with a wide broken line, an example of the I-V characteristic of the photoelectric conversion unit 13 which is measured when a voltage is applied between the first and second electrodes 11 and 12 under the condition where the photoelectric conversion unit 13 is not irradiated with light.

FIG. 3 illustrates a change in the density of a current that passes between the first and second electrodes 11 and 12 which occurs when the bias voltage applied between the first and second electrodes 11 and 12 is changed while the irradiance is maintained to be constant. The terms "forward direction" and "reverse direction" of a bias voltage used herein are defined as follows. In the case where the photoelectric conversion layer 15 has a junction structure constituted by a p-type semiconductor layer and an n-type semiconductor layer, a bias voltage that makes the potential of the p-type semiconductor layer higher than that of the n-type semiconductor layer is defined as a "forward-direction" bias voltage, while a bias voltage that makes the potential of the p-type semiconductor layer lower than that of the n-type semiconductor layer is defined as a "reverse-direction" bias voltage. In the case where organic semiconductor materials are used, the forward and reverse directions of a bias voltage can be defined as in the case where inorganic semiconductor materials are used. In the case where the photoelectric conversion layer 15 has a bulk heterojunction structure, the forward and reverse directions of a bias voltage are defined between the photoelectric conversion layer 15 and an electrode adjacent to the photoelectric conversion layer 15. Specifically, the forward-direction bias voltage is a bias voltage applied to the electrode so as to increase the ease of injecting electrons or holes to one of the HOMO and LUMO energy levels of the organic materials included in the photoelectric conversion layer 15 which is the closest to the Fermi level of the electrode material constituting the electrode, while the reverse-direction bias voltage is a bias voltage applied to the electrode so as to reduce the ease of injecting electrons or holes to the above HOMO or LUMO energy level. For example, in the case where the LUMO energy level of the acceptor included in the photoelectric conversion layer 15 is the closest to the Fermi level of the electrode material, it is possible to easily inject electrons to the photoelectric conversion layer 15. In such a case, a positive voltage applied to the electrode adjacent to the photoelectric conversion layer 15 serves as a reverse-direction bias voltage, while a negative voltage applied to the adjacent electrode serves as a forward-direction bias voltage.

As illustrated in FIG. 3, the photocurrent characteristic of the photoelectric conversion unit 13 according to the embodiment of the present disclosure is generally distinguished by first, second, and third voltage ranges. In FIG. 3, the second voltage range is the range of the reverse bias voltage, in which the absolute value of the density of the output current increases with an increase in the reverse-direction bias voltage. Specifically, the second voltage range is a range in which the amount of current increases with an increase in the amount of light incident on the photoelectric conversion layer 15 and an increase in the bias voltage applied between the first and second electrodes 11 and 12. The third voltage range is the range of the forward bias voltage, in which the density of the output current increases with an increase in the forward-direction bias voltage. Specifically, the third voltage range is a range in which the amount of current increases with an increase in the bias voltage applied between the first and second electrodes 11 and 12 even when the photoelectric conversion layer 15 is not irradiated with light. The first voltage range is a voltage range that exists between the second and third voltage ranges. In the first voltage range, the dependence of the change in current that passes across the photoelectric conversion unit 13 on the voltage applied between the first and second electrodes 11 and 12 and the amount of light incident on the photoelectric conversion layer 15 is small. In other words, it is considered that the amount of current that passes across the photoelectric conversion unit 13 does not substantially change in the first voltage range regardless of whether or not the photoelectric conversion layer 15 is irradiated with light. In the first voltage range, electron-hole pairs generated upon the photoelectric conversion layer 15 being irradiated with light predominantly recombine rather than be separated into holes and electrons when the absolute value of the voltage applied between the first and second electrodes 11 and 12 is small. Even when the electron-hole pairs are separated into holes and electrons, the energy barrier interposed between the photoelectric conversion layer 15 and the first electrode 11 suppresses the transfer of the charges and, accordingly, the current that passes across the photoelectric conversion unit 13 is considerably small.

It is considered that the amount of current that passes across the photoelectric conversion unit 13 is substantially equal between the period during which the photoelectric conversion layer 15 is irradiated with light (hereinafter, this period is referred to as "bright time") and the period during which the photoelectric conversion layer 15 is not irradiated with light (hereinafter, this period is referred to as "dark time") when the condition (1) below is satisfied:

$$\frac{|Id(V)|}{|Ib(V)|} < 10 \text{ or } \frac{|Ib(V)|}{|Id(V)|} < 10 \quad (1)$$

where Id(V) represents the amount of current that passes across the photoelectric conversion unit 13 upon a voltage V being applied between the first and second electrodes 11 and 12 under the condition where the photoelectric conversion layer 15 is not irradiated with light; and Ib(V) represents the amount of current that passes across the photoelectric conversion unit 13 upon a voltage V being applied between the first and second electrodes 11 and 12 under the condition where the photoelectric conversion layer 15 is irradiated with light. In this embodiment, it is considered that the photoelectric conversion layer 15 is irradiated with light when the intensity of the light is, for example, 100 mW/cm². In consideration of normal indoor illuminance, the intensity of the light may be, for example, 50 μW/cm² or more.

The first voltage range of the photoelectric conversion unit 13 included in the imaging device according to the embodiment of the present disclosure has a width of 0.5 V or more. Since the photoelectric conversion unit 13 has the above-described current-voltage characteristic, the imaging device 100 is capable of achieving the global shutter function with a simple pixel circuit structure.

Figure 4:
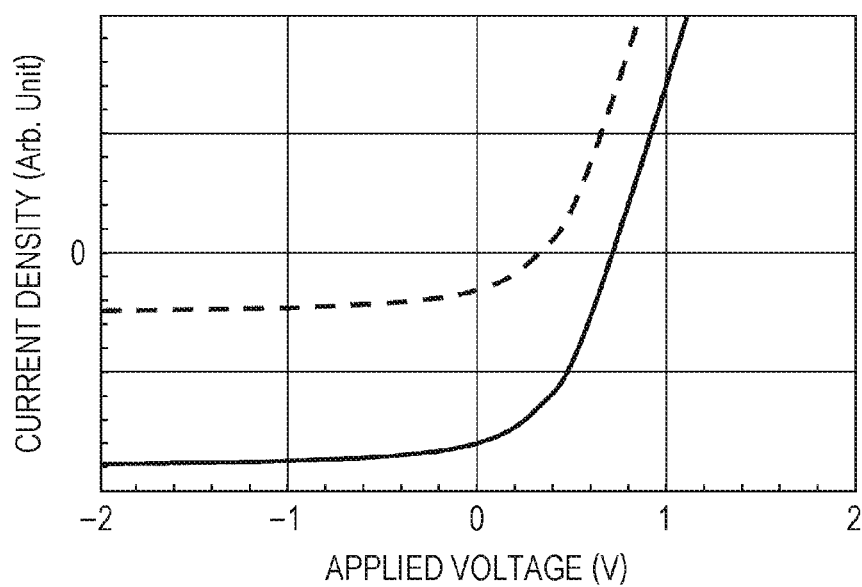
FIG. 4 is a diagram illustrating an example of the current-voltage characteristic of a photoelectric conversion unit included in an imaging device used in the related art.

FIG. 4 illustrates an example of the current-voltage characteristic of a photoelectric conversion unit used in the related art. In FIG. 4, an example of the I-V characteristic of a photoelectric conversion unit used in the related art which is measured when a voltage is applied between the first and second electrodes under the condition where the photoelectric conversion unit is irradiated with light is shown with a solid line and an example of the I-V characteristic of a photoelectric conversion unit used in the related art which is measured when a voltage is applied between the first and second electrodes under the condition where the photoelectric conversion unit is not irradiated with light is shown with a broken line. The photoelectric conversion unit used in the related art does not substantially have the first voltage range in which the condition (1) is satisfied.

Figure 8:
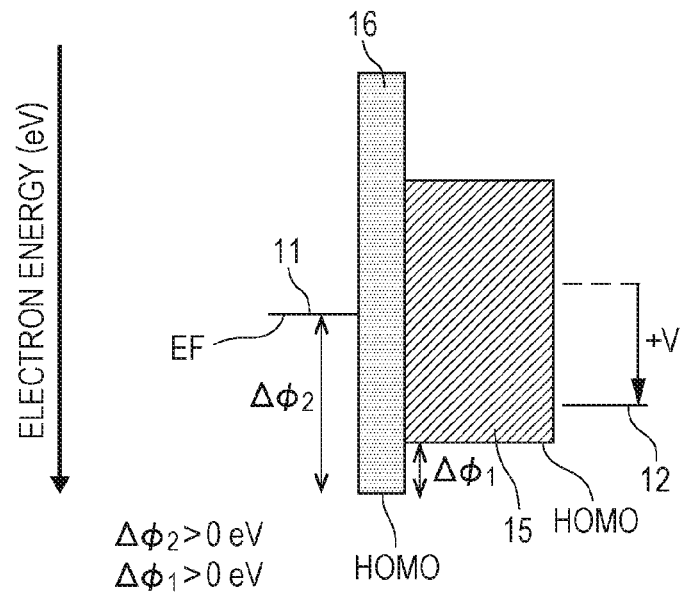
FIG. 8 is an example of the energy band diagram of a photoelectric conversion unit included in an imaging device according to an embodiment of the present disclosure in which holes are used as signal charges.
Figure 9:
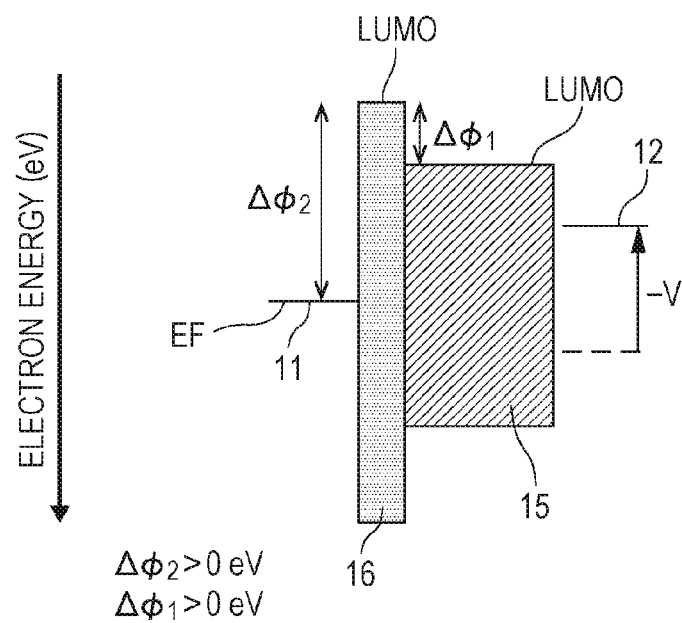
FIG. 9 is an example of the energy band diagram of a photoelectric conversion unit included in an imaging device according to an embodiment of the present disclosure in which electrons are used as signal charges.

In the case where the signal charges that are to be detected are holes, the charge-blocking layer 16 may have a HOMO energy level deeper than both the HOMO energy level of the photoelectric conversion layer 15 and the Fermi level EF of the first electrode 11 as illustrated in FIG. 8. In the case where the signal charges are electrons, the charge-blocking layer 16 may have a LUMO energy level shallower than both the LUMO energy level of the photoelectric conversion layer 15 and the Fermi level of the first electrode 11 as illustrated in FIG. 9. When the photoelectric conversion unit 13 has the above-described structure, the photoelectric conversion unit 13 may have a first voltage range having a width of 0.5 V or more.

Action of Imaging Device 100

Figure 5:
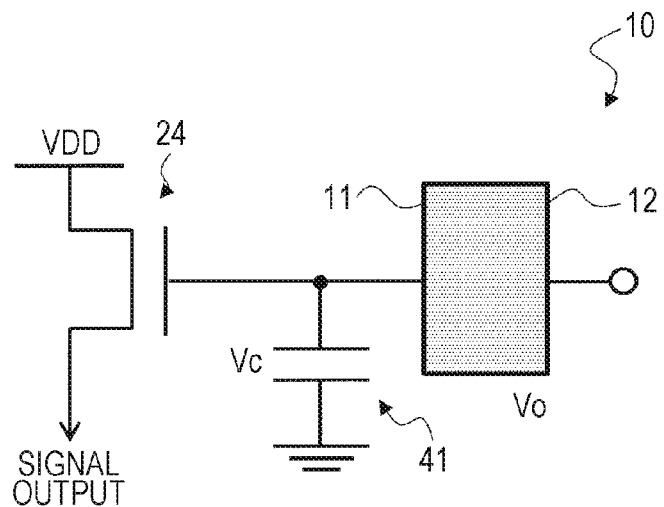
FIG. 5 is a schematic diagram illustrating a part of the circuit of a unit pixel included in an imaging device according to an embodiment of the present disclosure.

The action of the imaging device 100 is described with reference to FIGS. 3 and 5. An example where holes are used as signal charges is described below. FIG. 5 schematically illustrates the circuit structure of the unit pixel 10. In FIG. 5, the charge accumulation region 41 is connected to ground via a capacitor for the sake of simplicity, and the voltage Vc of the charge accumulation region 41 is reset to a reference voltage Vref. The conditions illustrated in FIG. 5 correspond to the case where, for example, the reference voltage Vref is applied to the reset voltage lines 44 illustrated in FIG. 1. The reference voltage Vref may be 0 V.

Initial State

In the initial state, the difference in potential between the first and second electrodes 11 and 12 included in the photoelectric conversion unit 13, that is, the voltage applied across the photoelectric conversion layer 15 and the charge-blocking layer 16, is set to fall within the first voltage range. For example, a voltage equal to the voltage of the first electrode 11 is applied to the second electrode 12 through the corresponding one of the sensitivity control lines 42. In this example, the voltage V2 of the second electrode 12 is set to the reference voltage Vref. In this case, when the voltage applied across the photoelectric conversion unit 13 is represented by Vo, Vo=0 V since V2=Vo+Vc=Vo+Vref.

During Exposure Period

At the beginning of the exposure period, a voltage Vg, which is different from the reference voltage Vref, is applied to the second electrode 12 through the corresponding one of the sensitivity control lines 42 such that a voltage that falls within the second voltage range, that is, a reverse bias voltage, is applied across the photoelectric conversion unit 13. For example, in the case where the photoelectric conversion layer 15 is composed of an organic material, the voltage Vg is a few volts to about 10 volts at maximum.

Upon the photoelectric conversion layer 15 of the photoelectric conversion unit 13 included in each of the unit pixels 10 being irradiated with light under the above conditions, electron-hole pairs are generated in the photoelectric conversion layer 15 by photoelectric conversion in an amount appropriate to the amount of light incident on the photoelectric conversion layer 15. The holes are transferred to the first electrode 11 due to the difference in potential between the first and second electrodes 11 and 12 and accumulated at the charge accumulation region 41. Consequently, the voltage Vc of the charge accumulation region 41 increases from the reference voltage. Since the amount of light incident on the photoelectric conversion layer 15 varies among the unit pixels 10, the voltage Vc also varies among the unit pixels 10. Since electron-hole pairs are not generated in pixels on which light is not incident, Vc does not change from the reference potential Vref in such pixels. Since Vo=V2−Vc, the voltage Vo applied across the photoelectric conversion unit 13 varies among the unit pixels 10.

Non-Exposure Period

Subsequent to the termination of the exposure period, the voltage V2 is applied to the second electrode 12 through the corresponding one of the sensitivity control line 42 such that a voltage that falls within the first voltage range is applied across the photoelectric conversion unit 13. For example, V2 is set to the reference voltage Vref. Since a certain amount of holes which is appropriate to the amount of light incident on the photoelectric conversion layer 15 during the exposure period are accumulated at the charge accumulation region 41 of each of the unit pixels 10, Vc varies among the pixels. Since Vo=V2−Vc, in some of the unit pixels 10 which have not been exposed to light and in which Vc has not been changed, Vc=Vref and Vo=0. On the other hand, Vo is not always zero in the other unit pixels 10 in which Vc has been changed. However, since the first voltage range has a width of 0.5 V or more, it is possible to set the voltage V2 such that the voltage Vo applied across the photoelectric conversion unit 13 of each of the unit pixels 10 falls within the first voltage range although Vc varies among the unit pixels 10. The variations in Vc correspond to the degree of dynamic range. When the first voltage range has a width of 0.5 V or more, for example, a dynamic range of 80 dB or more, which is comparable to that of the human eye, may be achieved using an imaging device having a conversion gain of 50 μV/e⁻.

Under the condition where a voltage that falls within the first voltage range is applied to the second electrode 12, holes are not transferred to the charge accumulation region 41 even when light is incident on the unit pixel 10. Furthermore, the discharge of the charges accumulated at the charge accumulation region 41 to the first electrode 11 and the intrusion of charges fed from the voltage supply circuit 32 into the charge accumulation region 41 through the first electrode 11 are prevented.

Thus, holes are maintained in each of the unit pixels 10 in the amount appropriate to the amount of light incident on the photoelectric conversion layer 15. Specifically, the holes stored in each of the unit pixels 10 are maintained until the holes accumulated in the charge accumulation region 41 are reset even when the photoelectric conversion layer 15 is again irradiated with light. Accordingly, even when the readout operation is performed sequentially on a row-by-row-basis in the non-exposure period, new charges are not accumulated during the readout operation. This prevents the occurrence of rolling distortion, which may occur in a rolling-shutter mode. Thus, the imaging device 100 is capable of achieving the global shutter function with a simple pixel circuit structure such as the unit pixel 10 which does not include either a transfer transistor or an additional storage capacitor. Moreover, the simple pixel circuit of the imaging device 100 advantageously enables a reduction in the size of the unit pixels 10.

Figure 6:
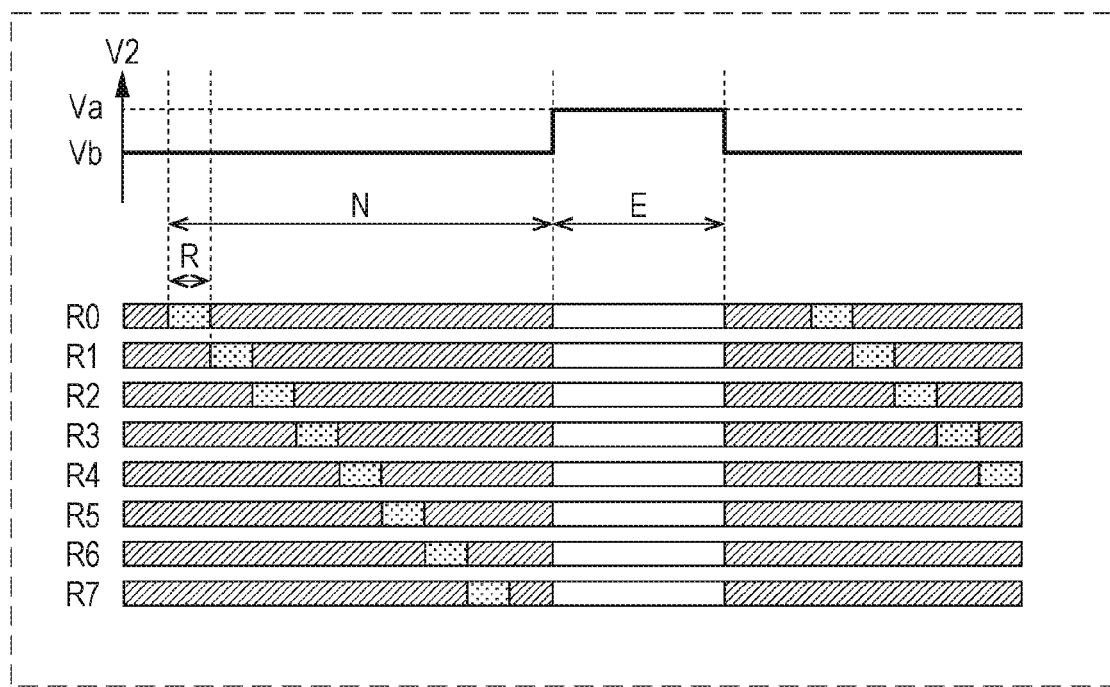
FIG. 6 is a schematic diagram illustrating an example of the timings at which an exposure period is held and a voltage applied to a photoelectric conversion unit is changed in an imaging device according to an embodiment of the present disclosure.

FIG. 6 is a chart illustrating the voltage Vo applied across the photoelectric conversion unit 13 and the timings at which the above actions are performed in each of the rows of the pixel array PA of the imaging device 100. In FIG. 6, the rows of the pixel array PA are denoted by R0 to R7, and only the voltage V2 and the timings at which exposure and signal readout are performed are illustrated for the sake of simplicity. In the imaging device 100, the voltage Vb that falls within the first voltage range is applied across the photoelectric conversion unit 13 during the non-exposure period N, and the voltage Va that falls within the second voltage range is applied across the photoelectric conversion unit 13 during the exposure period E. The signal readout R in each of the rows R0 to R7 is sequentially performed during the non-exposure period N as illustrated in FIG. 6. The exposure period E is started or terminated at the same time in each of the rows R0 to R7. In other words, the imaging device 100 achieves a global shutter function while performing the readout of signals sequentially.

EXAMPLES

Example 1

Figure 7A:
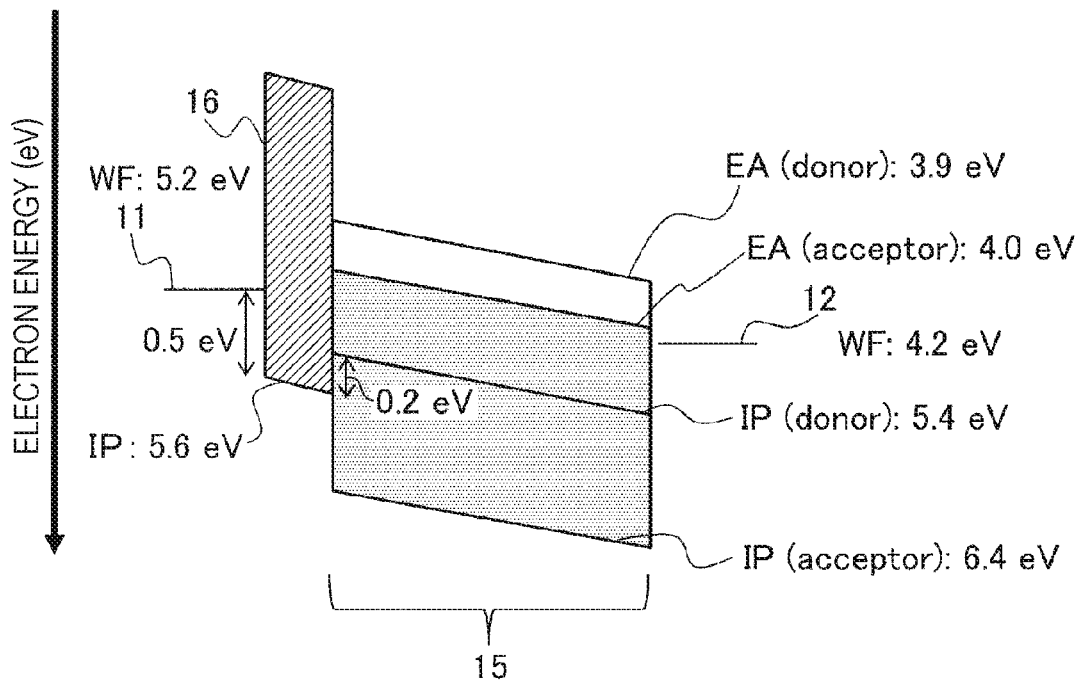
FIG. 7A is an example of the energy band diagram of a photoelectric conversion unit included in an imaging device according to an embodiment of the present disclosure.

FIG. 7A illustrates the energy band diagrams of the components of the photoelectric conversion unit 13 prepared in Example 1. In Example 1, the second electrode 12 was composed of Al, and the first electrode 11 was composed of ITO, which is a transparent electrode material. The photoelectric conversion layer 15 included silicon naphthalocyanine bis(trihexylsilyloxide) (Si(OSiHex₃)₂Nc) represented by Formula (2) below and C₆₀ represented by Formula (3) below. The charge-blocking layer 16 included di-[4-(N,N-ditolyl-amino)-phenyl]cyclohexane (TAPC) represented by Formula (4) below. In the photoelectric conversion layer 15, silicon naphthalocyanine bis(trihexylsilyloxide) served as a donor material, and C₆₀ served as an acceptor material.

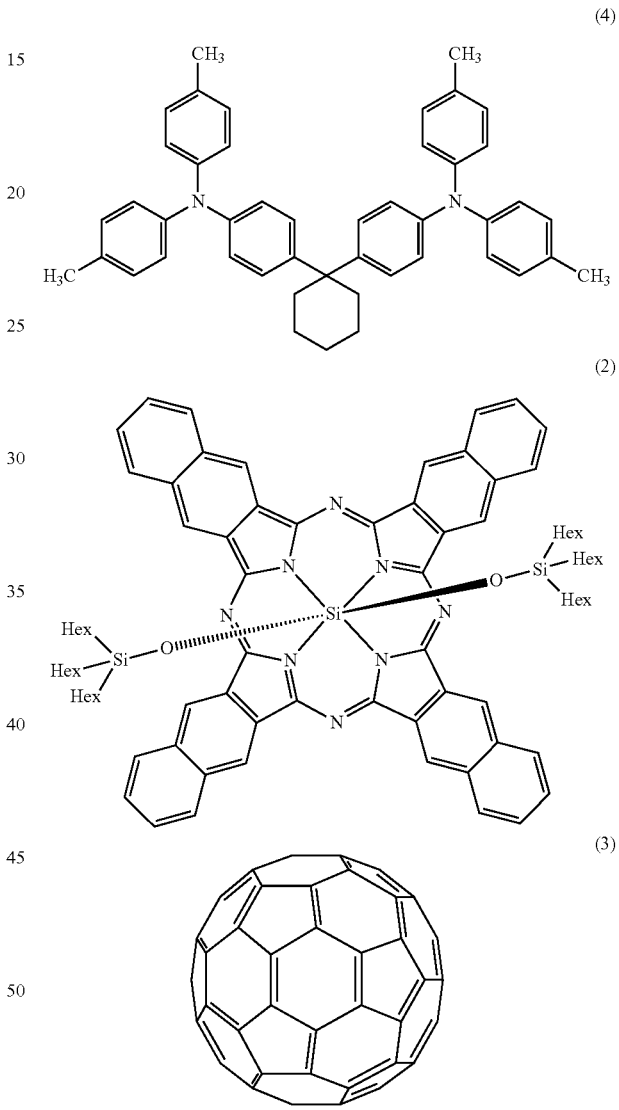

Table 1 summarizes the work functions of ITO and Al, the ionization potentials and electron affinities of silicon naphthalocyanine bis(trihexylsilyloxide) and C₆₀, and the ionization potential and electron affinity of TAPC. Hereinafter, work function, ionization potential, and electron affinity are abbreviated as "WF", "IP", and "EA", respectively. WF corresponds to the difference in energy between vacuum level and Fermi level. IP corresponds to the difference in energy between vacuum level and HOMO energy level. EA corresponds to the difference in energy between vacuum level and LUMO energy level. The IPs shown in Table 1 are determined by photoemission yield spectroscopy. The EAs shown in Table 1 are determined from the difference in energy between IP and the end portion of the absorption spectrum. WF, IP, and EA are all determined with respect to vacuum level. When referring to Fermi level, HOMO energy level, or LUMO energy level, the term "deep energy level" refers to a high WF, IP, or EA, respectively. In the energy band diagrams illustrated in FIG. 7A and hereinafter, the vertical axis arrow denotes the direction in which energy level becomes deeper or WF, IP, or EA becomes higher.

TABLE 1

|  | WF (eV) | IP (eV) | EA (eV) |
|---|---|---|---|
| ITO | 5.2 | — | — |
| Al | 4.2 | — | — |
| TAPC | — | 5.6 | 2.0 |
| Silicon naphthalocyanine bis(trihexylsilyloxide) | — | 5.4 | 3.9 |
| $C_{60}$ | — | 6.4 | 4.0 |

In Example 1, the photoelectric conversion unit 13 was prepared by the following method. An ITO film was formed on a clean glass substrate. The ITO film was shaped in a pattern to form a first electrode 11. On the first electrode 11, a charge-blocking layer 16 having a thickness of 50 nm and a photoelectric conversion layer 15 having a thickness of 400 nm were formed by vacuum deposition. For forming the photoelectric conversion layer 15, the deposition of silicon naphthalocyanine bis(trihexylsilyloxide) and $C_{60}$ was performed simultaneously by co-deposition. Al was deposited on the photoelectric conversion layer 15 by vacuum deposition to form a second electrode 12. Since TAPC, which was used as a material for the charge-blocking layer 16 in Example 1, has a lower absorption coefficient than the photoelectric conversion layer 15 in the visible light range and the charge-blocking layer 16 had a small thickness of 50 nm, 70% or more the amount of visible light incident on the charge-blocking layer 16 passed through the charge-blocking layer 16.

In Example 1, the difference in energy between the WF of the second electrode 12 and the EA of the adjacent photoelectric conversion layer 15 was small. Accordingly, in the photoelectric conversion unit 13 prepared in Example 1, applying a negative voltage to the first electrode 11 or applying a positive voltage to the second electrode 12 causes a reverse bias to be applied across the photoelectric conversion layer 15.

Although, in Example 1, the photoelectric conversion unit 13 is prepared using the first electrode 11 as a transparent electrode and the second electrode 12 as a light-shielding electrode such that the photoelectric conversion layer 15 is irradiated with light on the substrate side, the structure of the photoelectric conversion unit 13 is not limited to this. A photoelectric conversion unit 13 prepared using the first electrode 11 as a light-shielding electrode and the second electrode 12 as a transparent electrode such that the photoelectric conversion layer 15 is irradiated with light on the second-electrode side may have the same advantageous effects as the above-described photoelectric conversion unit 13.

Figure 7B:
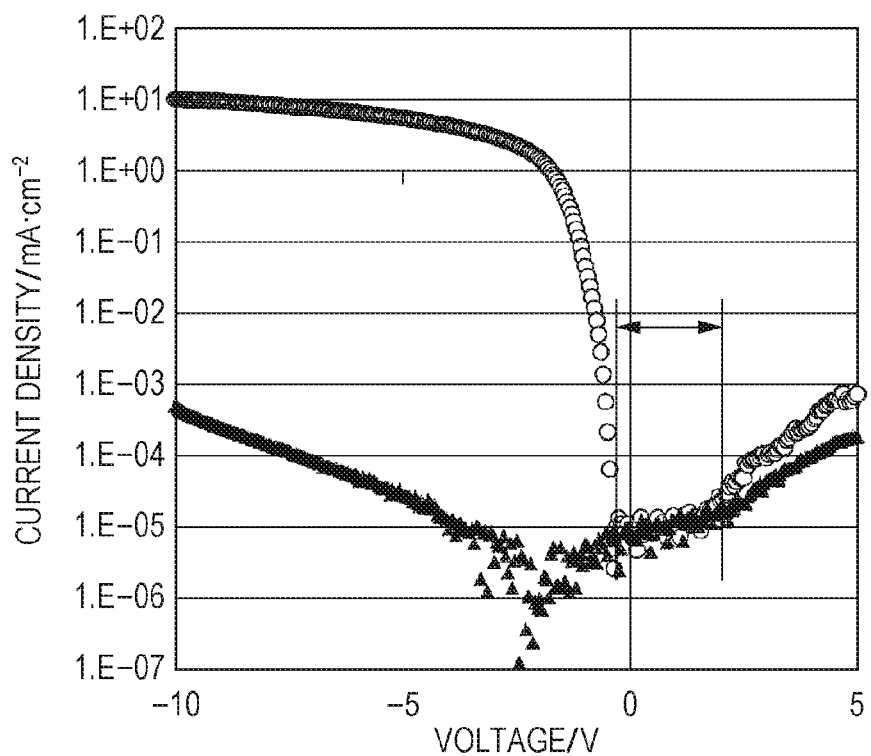
FIG. 7B is a diagram illustrating an example of the current-voltage characteristic of a photoelectric conversion unit included in an imaging device according to an embodiment of the present disclosure.

The current-voltage characteristic of the photoelectric conversion unit 13 prepared in Example 1 was determined by the following method. Under the condition where the photoelectric conversion unit 13 was not irradiated with light and the condition where the photoelectric conversion unit 13 was irradiated with light, a voltage was applied to the first electrode 11 included in the photoelectric conversion unit 13 and the amount of current that passed between the first and second electrodes 11 and 12 was measured. Note that, the same results would be obtained when a voltage having the same absolute value and the opposite polarity was applied to the second electrode 12 instead of applying the voltage to the first electrode 11. The light with which the photoelectric conversion unit 13 was irradiated was artificial sunlight having an irradiance of 100 mW/cm². FIG. 7B illustrates the results. In FIG. 7B, the results obtained in the case where the photoelectric conversion unit 13 was irradiated with light are denoted by open circles, and the results obtained in the case where the photoelectric conversion unit 13 was not irradiated with light are denoted by filled triangles.

In Example 1, the amount of current that passed across the photoelectric conversion unit 13 in the bright time was substantially equal to that in the dark time in the voltage range of about −0.5 to 2.0 V, which is denoted by the double-headed arrow in FIG. 7B. In other words, the voltage range of about −0.5 to 2.0 V was the first voltage range. Therefore, using the photoelectric conversion unit 13 enables the above-described operation of the imaging device. That is, an imaging device capable of achieving a global shutter function with a simple circuit may be produced by using the photoelectric conversion unit 13.

Example 2

Figure 10A:
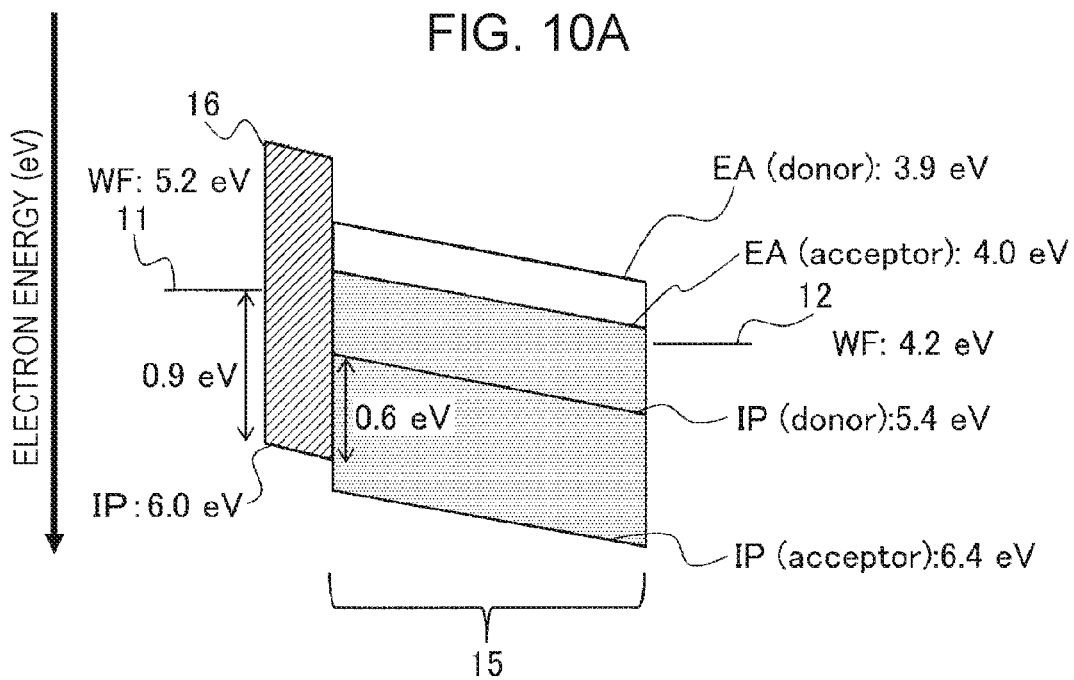
FIG. 10A is another example of the energy band diagram of a photoelectric conversion unit included in an imaging device according to an embodiment of the present disclosure.

FIG. 10A is the energy band diagram of a photoelectric conversion unit 13 prepared in Example 2. Example 2 is different from Example 1 in that 3,7-bis[4-(9H-carbazol-9-yl)phenyl]-2,6-diphenylbenzo[1,2-b:4,5-b']difuran (CZBDF) represented by Formula (5) below was used as a material for the charge-blocking layer in Example 2. The IP of CZBDF was 6.0 eV. That is, in Example 2, the IP of the charge-blocking layer 16 was further higher than both the IP of the donor material included in the adjacent photoelectric conversion layer 15 and the WF of the material constituting the adjacent first electrode 11. Specifically, the difference in energy between the IP of the charge-blocking layer 16 and the IP of the donor material included in the photoelectric conversion layer 15 was 0.6 eV.

(5)

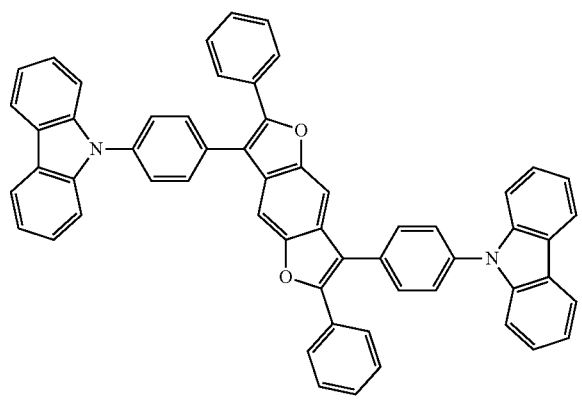

Figure 11A:
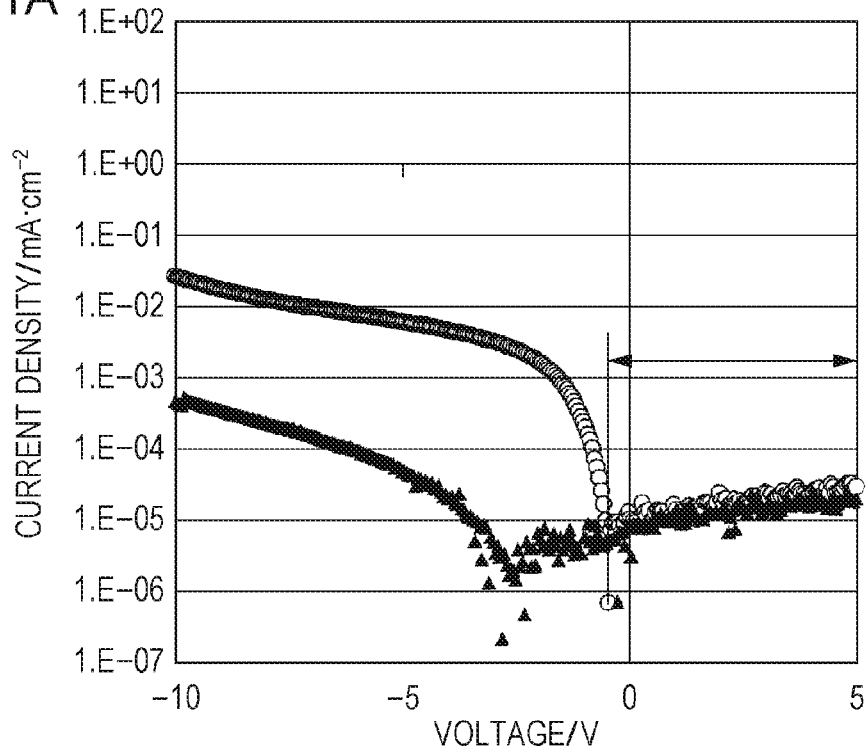
FIG. 11A is a diagram illustrating another example of the current-voltage characteristic of a photoelectric conversion unit included in an imaging device according to an embodiment of the present disclosure.

FIG. 11A illustrates the current-voltage characteristic of the photoelectric conversion unit 13 prepared in Example 2. The current-voltage characteristic of the photoelectric conversion unit 13 prepared in Example 2 was measured as in Example 1. In FIG. 11A, the results obtained in the case where the photoelectric conversion unit 13 was irradiated with light are denoted by open circles, and the results obtained in the case where the photoelectric conversion unit 13 was not irradiated with light are denoted by filled triangles.

In Example 2, the amount of current that passed across the photoelectric conversion unit 13 in the bright time was substantially equal to that in the dark time in the voltage range of about −0.5 to 5.0 V, which is denoted by the double-headed arrow in FIG. 11A. In other words, the voltage range of about −0.5 to 5.0 V was the first voltage range.

Reference Examples 1 to 3

Figure 10B:
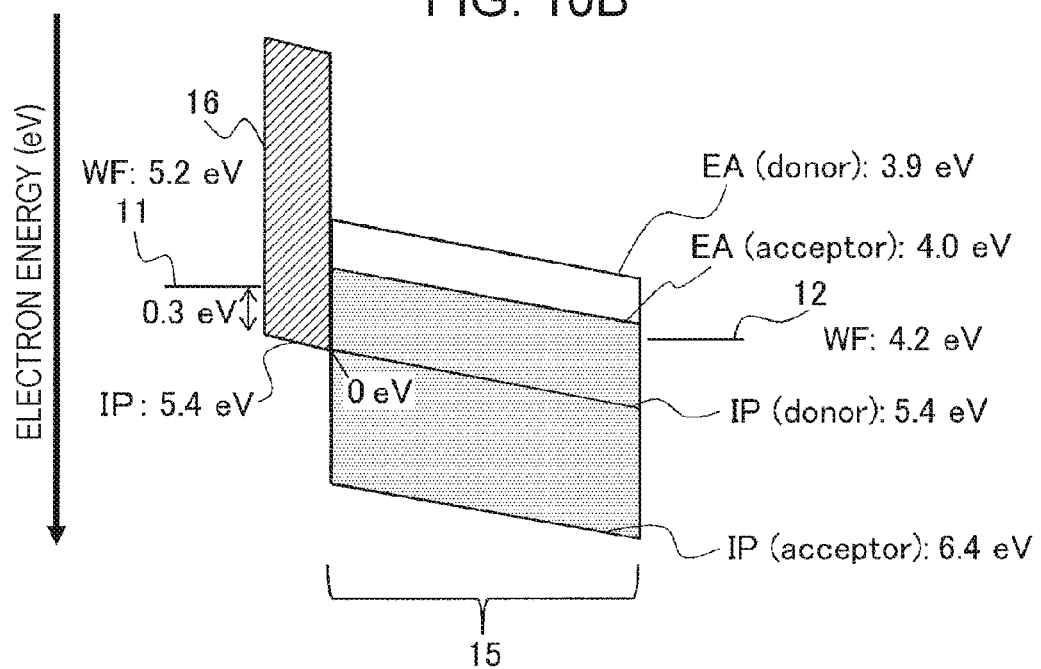
FIG. 10B is an example of the energy band diagram of a photoelectric conversion unit included in a reference imaging device.
Figure 10C:
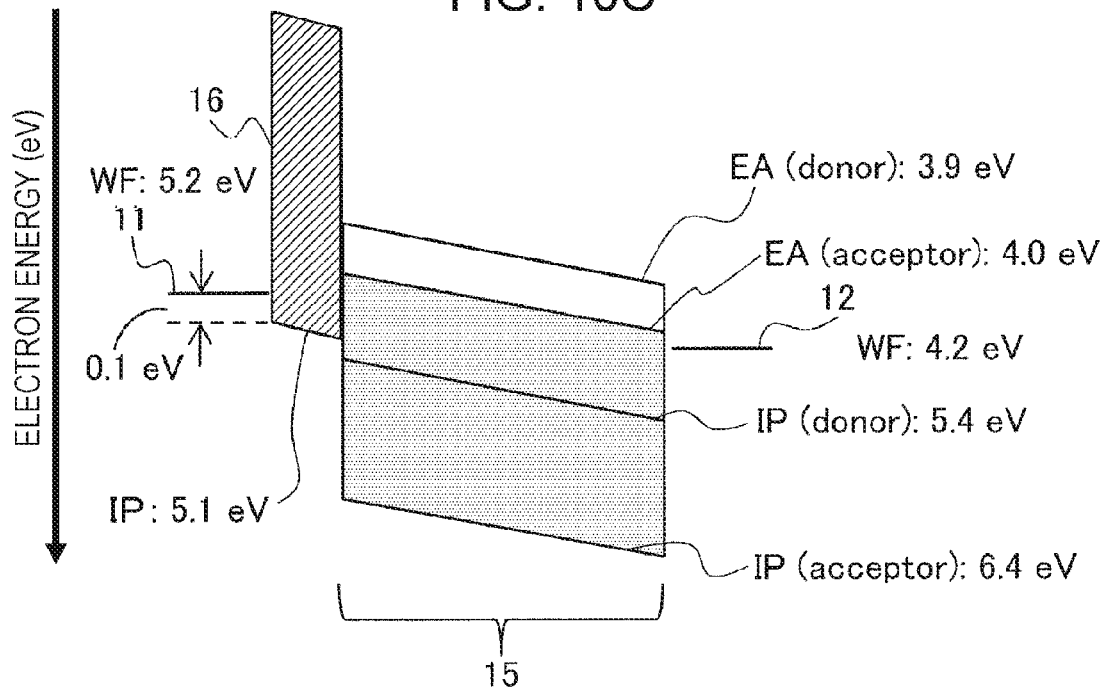
FIG. 10C is an example of the energy band diagram of a photoelectric conversion unit included in a reference imaging device.
Figure 10D:
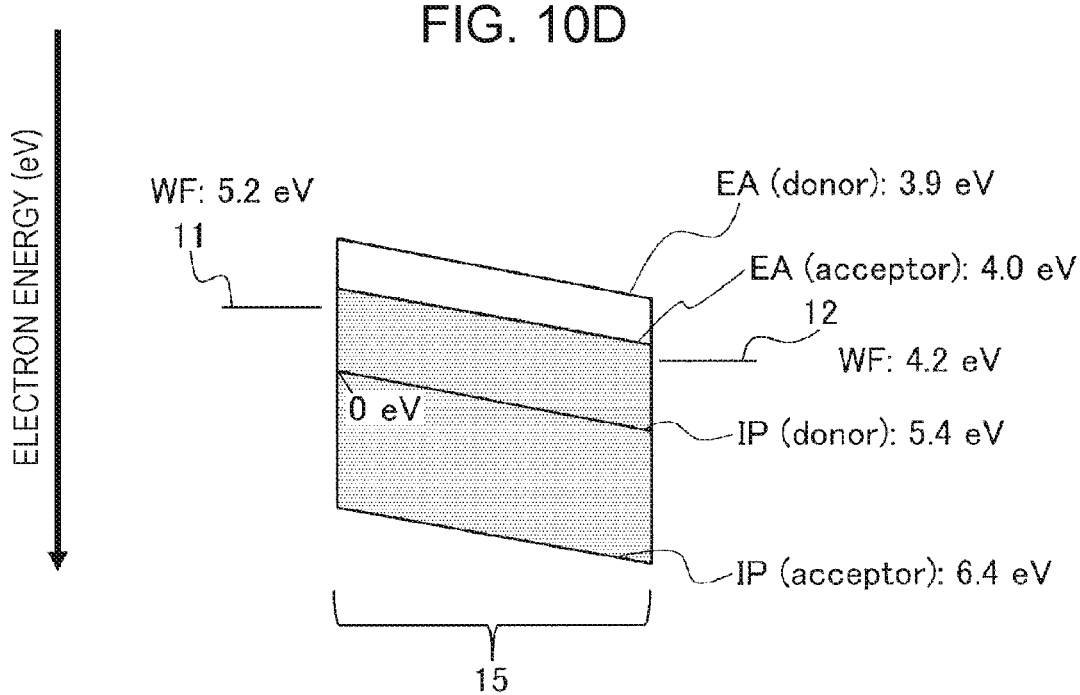
FIG. 10D is an example of the energy band diagram of a photoelectric conversion unit included in a reference imaging device.

FIG. 10B is the energy band diagram of a photoelectric conversion unit 13 prepared in Reference example 1. Reference example 1 is different from Example 1 in that N,N'-bis(3-methylphenyl)-N,N'-bis(phenyl)benzidine (TPD) represented by Formula (6) below was used as a material for the charge-blocking layer in Reference example 1. The IP of TPD was 5.4 eV. That is, in Reference example 1, the IP of the donor material included in the photoelectric conversion layer 15 was substantially equal to the IP of the charge-blocking layer 16. FIG. 10C is the energy band diagram of a photoelectric conversion unit 13 prepared in Reference example 2. Reference example 2 is different from Example 1 in that 4,4',4"-tris[phenyl(m-tolyl)amino]triphenylamine (m-MTDATA) represented by Formula (7) below was used as a material for the charge-blocking layer in Reference example 2. The IP of m-MTDATA was 5.1 eV. That is, in Reference example 2, the IP of the charge-blocking layer 16 was lower than the IP of the donor material included in the photoelectric conversion layer 15. FIG. 10D is the energy band diagram of a photoelectric conversion unit 13 prepared in Reference example 3. Reference example 3 is different from Example 1 in that the charge-blocking layer 16 was not used in Reference example 3.

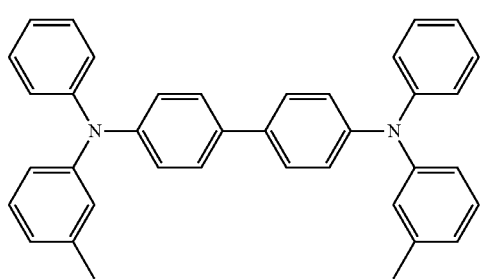

(6)

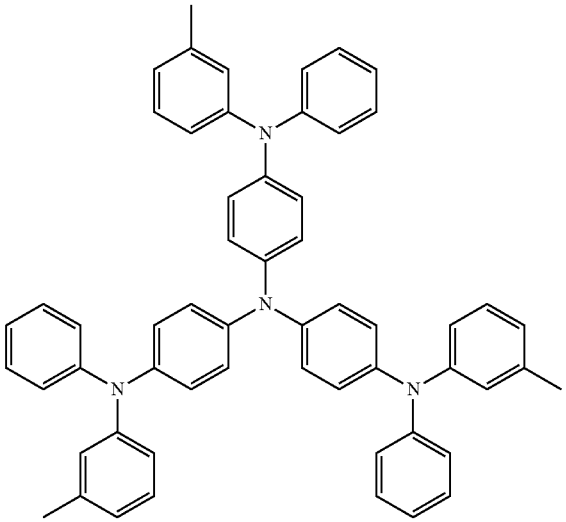

(7)

Figure 11B:
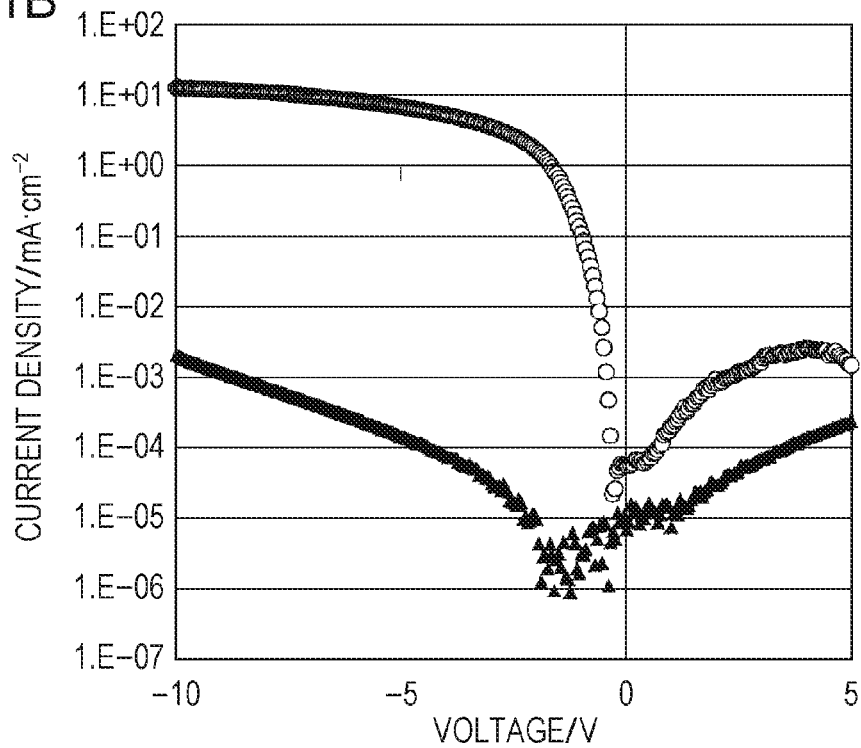
FIG. 11B is a diagram illustrating another example of the current-voltage characteristic of a photoelectric conversion unit included in a reference imaging device.
Figure 11C:
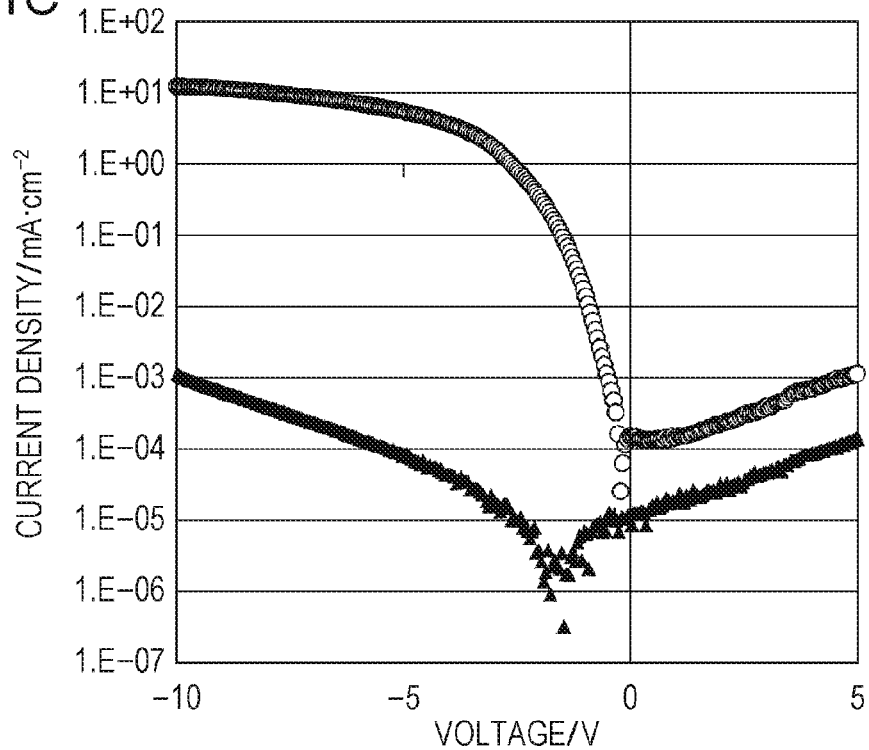
FIG. 11C is a diagram illustrating another example of the current-voltage characteristic of a photoelectric conversion unit included in a reference imaging device.
Figure 11D:
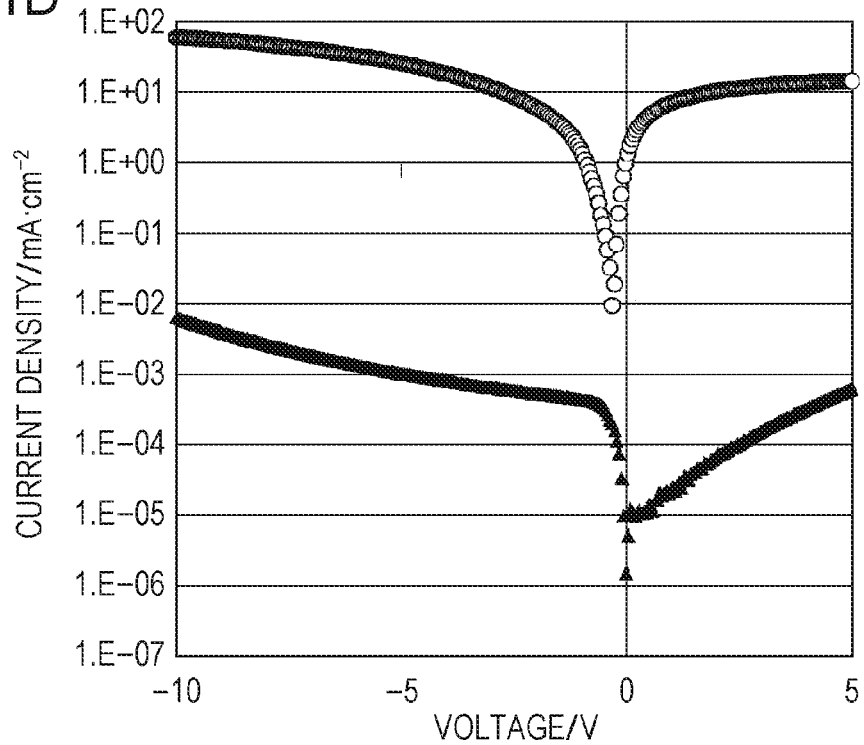
FIG. 11D is a diagram illustrating another example of the current-voltage characteristic of a photoelectric conversion unit included in a reference imaging device.

FIGS. 11B to 11D illustrate the current-voltage characteristics of the photoelectric conversion units 13 prepared in Reference examples 1 to 3, respectively. In FIGS. 11B to 11D, the results obtained in the case where the photoelectric conversion unit 13 was irradiated with light are denoted by open circles, and the results obtained in the case where the photoelectric conversion unit 13 was not irradiated with light are denoted by filled triangles. The current-voltage characteristics of the photoelectric conversion units 13 prepared in Reference examples 1 to 3 all did not have the first voltage range.

A comparison between the results obtained in Examples 1 and 2 and the results obtained in Reference examples 1 to 3 confirms that, in a hole-accumulation imaging device, the current-voltage characteristic of the photoelectric conversion unit 13 has the first voltage range when the IP of the charge-blocking layer 16 is higher than both the IP of the donor material included in the adjacent photoelectric conversion layer and the WF of the material constituting the adjacent first electrode. The difference in energy between the IP of the charge-blocking layer and the IP of the donor material included in the photoelectric conversion layer was 0.2 eV in Example 1 and 0.6 eV in Example 2, while the first voltage range was −0.5 to 2.0 V in Example 1 and −0.5 to 5.0 V in Example 2. A comparison between the results obtained in Examples 1 and 2 confirms that the width of the first voltage range increases with an increase in the difference in energy between the IP of the charge-blocking layer 16 and the IP of the donor material included in the adjacent photoelectric conversion layer.

In the case where the IP of the charge-blocking layer is deeper than the IP of the donor material included in the adjacent photoelectric conversion layer, it is necessary for the holes generated in the photoelectric conversion layer to overcome the energy barrier between the IPs of the charge-blocking layer and the donor material in order to reach the first electrode. However, in a voltage range in which the electric field applied across the photoelectric conversion layer is small, the charges generated in the photoelectric conversion layer cannot receive a sufficiently large amount of energy from the electric field and are not capable of overcoming the energy barrier. Consequently, the charges recombine inside the photoelectric conversion layer to deactivate rather than be extracted by the first electrode. The above voltage range in which such a small electric field is applied across the photoelectric conversion layer is the first voltage range. On the basis of the above discussion, it is considered that the width of the first voltage range may be increased by increasing the difference in energy between the IP of the charge-blocking layer 16 and the IP of the donor material included in the adjacent photoelectric conversion layer.

The wider the first voltage range of the current-voltage characteristic of the photoelectric conversion unit 13, the more suitable for producing an imaging device having a wide dynamic range. This is because, with an increase in variations in the amount of light incident on the pixel array PA among the unit pixels, the variations in the voltage Vc of the charge accumulation region 41 among the pixels are increased and, consequently, variations in the voltage Vo applied to the photoelectric conversion unit 13 at the termination of the exposure period among the pixels are also increased.

The amount of current that passed across the photoelectric conversion unit 13 while a reverse bias voltage was applied across the photoelectric conversion unit 13 under the condition where the photoelectric conversion unit 13 was irradiated with light in the case where the difference in energy between the IP of the charge-blocking layer 16 and the IP of the donor material of the photoelectric conversion layer was 0.6 eV (FIGS. 10A and 11A) was smaller than in the case where the above energy difference was 0.2 eV (FIGS. 7A and 7B). Accordingly, in order to increase the sensitivity of the imaging device 100, the difference in energy between the IP of the charge-blocking layer 16 and the IP of the donor material of the photoelectric conversion layer may be small. Specifically, the difference in energy between the IP of the charge-blocking layer 16 and the IP of the donor material of the photoelectric conversion layer may be set to 0.6 eV or less.

Although various structures in which the charge-blocking layer 16 was prepared using a different material are described in the above-described examples taking an imaging device that uses holes as signal charges as an example, an imaging device that uses electrons as signal charges may also be produced. An imaging device that uses electrons as signal charges may have the same advantageous effects as the above-described imaging device when the EA of the charge-blocking layer 16 is set to be lower than both the WF of the material constituting the adjacent first electrode and the EA of the acceptor material included in the adjacent photoelectric conversion layer. The difference in energy between the EA of the charge-blocking layer 16 and the WF of the material constituting the adjacent first electrode or the EA of the acceptor material included in the adjacent photoelectric conversion layer may be larger than 0 eV. In such a case, the degree of dynamic range of the imaging device 100 may be increased. The difference in energy between the EA of the charge-blocking layer 16 and the EA of the acceptor material included in the adjacent photoelectric conversion layer may be 0.2 eV or more. In such a case, the degree of dynamic range of the imaging device 100 may be further increased. The difference in energy between the EA of the charge-blocking layer 16 and the EA of the acceptor material included in the adjacent photoelectric conversion layer may be 0.6 eV or less. In such a case, the sensitivity of the imaging device 100 may be increased.

The imaging device according to the present disclosure may be used as a photo detector, an image sensor, or the like and is suitably used particularly for capturing an image of a fast-moving subject. Specific examples thereof include a machine vision camera and an on-vehicle camera. The machine vision camera may be used, for example, as an input unit for conducting the assessment of the conditions of products, the detection of the defects of products, and the classification of products by image recognition in a production factory. The on-vehicle camera may be used, for example, for input to a control system that enables safe travel of a vehicle or for assisting the operator for safe travel of a vehicle. It is also possible to capture an image using infrared radiation in addition to a color image by appropriately selecting the materials constituting the photoelectric conversion layer. An imaging device capable of capturing an image using infrared radiation may be used as a security camera, an on-vehicle camera, or the like.

What is claimed is:

1. An imaging device comprising pixels, each pixel including:
   a photoelectric conversion unit including:
      a first electrode including a first conducting material,
      a second electrode facing the first electrode,
      a photoelectric conversion layer between the first and second electrodes, the photoelectric conversion layer including a first photoelectric conversion material, and
      a hole-blocking layer between the first electrode and the photoelectric conversion layer, the hole-blocking layer including a hole-blocking material; and
   a signal detection transistor having a gate electrically connected to the first electrode, wherein
   the hole-blocking material has an electron affinity lower than both a work function of the first conducting material and an electron affinity of the first photoelectric conversion material,
   the photoelectric conversion unit is adapted to be applied with a voltage between the first electrode and the second electrode, and the photoelectric conversion unit has a characteristic, responsive to the voltage within a range from a first voltage to a second voltage, showing that a density of current passing between the first electrode and the second electrode when light is incident on the photoelectric conversion layer becomes substantially equal to that when no light is incident on the photoelectric conversion layer,
   the range from the first voltage to the second voltage includes 0V, and
   a difference between the first voltage and the second voltage is 0.5 V or more.

2. The imaging device according to claim 1, wherein a difference in energy between the electron affinity of the hole-blocking material and the electron affinity of the first photoelectric conversion material is 0.2 eV or more.

3. The imaging device according to claim 1, wherein a difference in energy between the electron affinity of the hole-blocking material and the electron affinity of the first photoelectric conversion material is 0.6 eV or less.

4. The imaging device according to claim 1, wherein the signal detection transistor detects electrons extracted from the photoelectric conversion layer.

5. The imaging device according to claim 1, wherein the first photoelectric conversion material includes an organic material.

6. The imaging device according to claim 1, wherein:
   the photoelectric conversion layer includes a second photoelectric conversion material; and
   the second photoelectric conversion material has an electron affinity lower than an electron affinity of the first photoelectric conversion material or an ionization potential lower than an ionization potential of the first photoelectric conversion material.

7. The imaging device according to claim 1, wherein a difference in energy between the electron affinity of the hole-blocking material and the electron affinity of the first photoelectric conversion material is 0.2 eV or more and 0.6 eV or less.

8. The imaging device according to claim 1, wherein the difference between the first voltage and the second voltage is 0.5 V or more and 5.5 V or less.

* * * * *